(12) United States Patent
Kashiyama et al.

(10) Patent No.: US 11,647,631 B2
(45) Date of Patent: May 9, 2023

(54) SEMICONDUCTOR MEMORY DEVICE

(71) Applicant: Kioxia Corporation, Tokyo (JP)

(72) Inventors: Shota Kashiyama, Yokkaichi Mie (JP); Satoshi Nagashima, Yokkaichi Mie (JP)

(73) Assignee: Kioxia Corporation

( * ) Notice: Subject to any disclaimer, the term of this patent is extended or adjusted under 35 U.S.C. 154(b) by 200 days.

(21) Appl. No.: 17/022,958

(22) Filed: Sep. 16, 2020

(65) Prior Publication Data

US 2021/0280601 A1 Sep. 9, 2021

(30) Foreign Application Priority Data

Mar. 9, 2020 (JP) .............................. JP2020-040138

(51) Int. Cl.
*H01L 27/11519* (2017.01)
*H01L 27/11582* (2017.01)
*H01L 27/11556* (2017.01)
*H01L 27/11521* (2017.01)

(52) U.S. Cl.
CPC .. *H01L 27/11582* (2013.01); *H01L 27/11519* (2013.01); *H01L 27/11521* (2013.01); *H01L 27/11556* (2013.01)

(58) Field of Classification Search
CPC ......... H01L 27/11582; H01L 27/11568; H01L 27/11556; H01L 27/11519; H01L 27/11521
See application file for complete search history.

(56) References Cited

U.S. PATENT DOCUMENTS

| 7,005,350 | B2 | 2/2006 | Walker | |
| 9,159,426 | B1 | 10/2015 | D'Abreu | |
| 10,276,585 | B2 | 4/2019 | Utsumi | |
| 2018/0308858 | A1* | 10/2018 | Hopkins | ........... H01L 27/11524 |
| 2019/0198521 | A1 | 6/2019 | Komiya | |
| 2019/0312055 | A1* | 10/2019 | Baek | .................. H01L 27/0688 |
| 2020/0385371 | A1* | 12/2020 | Al-Awar | ............ A61K 31/5377 |

FOREIGN PATENT DOCUMENTS

| JP | 2006-512776 A | 4/2006 |
| JP | 2018-26518 A | 2/2018 |
| JP | 2019-114745 A | 7/2019 |

\* cited by examiner

*Primary Examiner* — Sarah K Salerno
(74) *Attorney, Agent, or Firm* — Foley & Lardner LLP

(57) ABSTRACT

A semiconductor memory device includes a first semiconductor layer that includes a first part extending in a first direction, a second part extending in the first direction, and a third part connected to the first and second parts. When a cross-sectional surface extending in second and third directions and including the third part is defined as a first cross-sectional surface, the third part has one side and the other side of an imaginary center line in the third direction in the first cross-sectional surface defined as first and second regions, the third part has maximum widths in the second direction in the first and second regions defined as first and second widths, and the third part has a width in the second direction on the imaginary center line defined as a third width, the third width is smaller than the first and second widths.

6 Claims, 36 Drawing Sheets

SEMICONDUCTOR MEMORY DEVICE

CROSS-REFERENCE TO RELATED APPLICATIONS

This application is based upon and claims the benefit of Japanese Patent Application No. 2020-040138, filed on Mar. 9, 2020, the entire contents of which are incorporated herein by reference.

BACKGROUND

Field

Embodiments described herein relate generally to a semiconductor memory device.

Description of the Related Art

There has been known a semiconductor memory device that includes a substrate, a plurality of conducting layers laminated in a first direction that intersects with a surface of the substrate, a semiconductor layer that extends in the first direction and is opposed to the plurality of conducting layers, and a gate insulating film disposed between the conducting layers and the semiconductor layer. The gate insulating film includes a memory unit, such as a silicon nitride film (SiN) and a floating gate, configured to store data.

DETAILED DESCRIPTION

Figure 1:
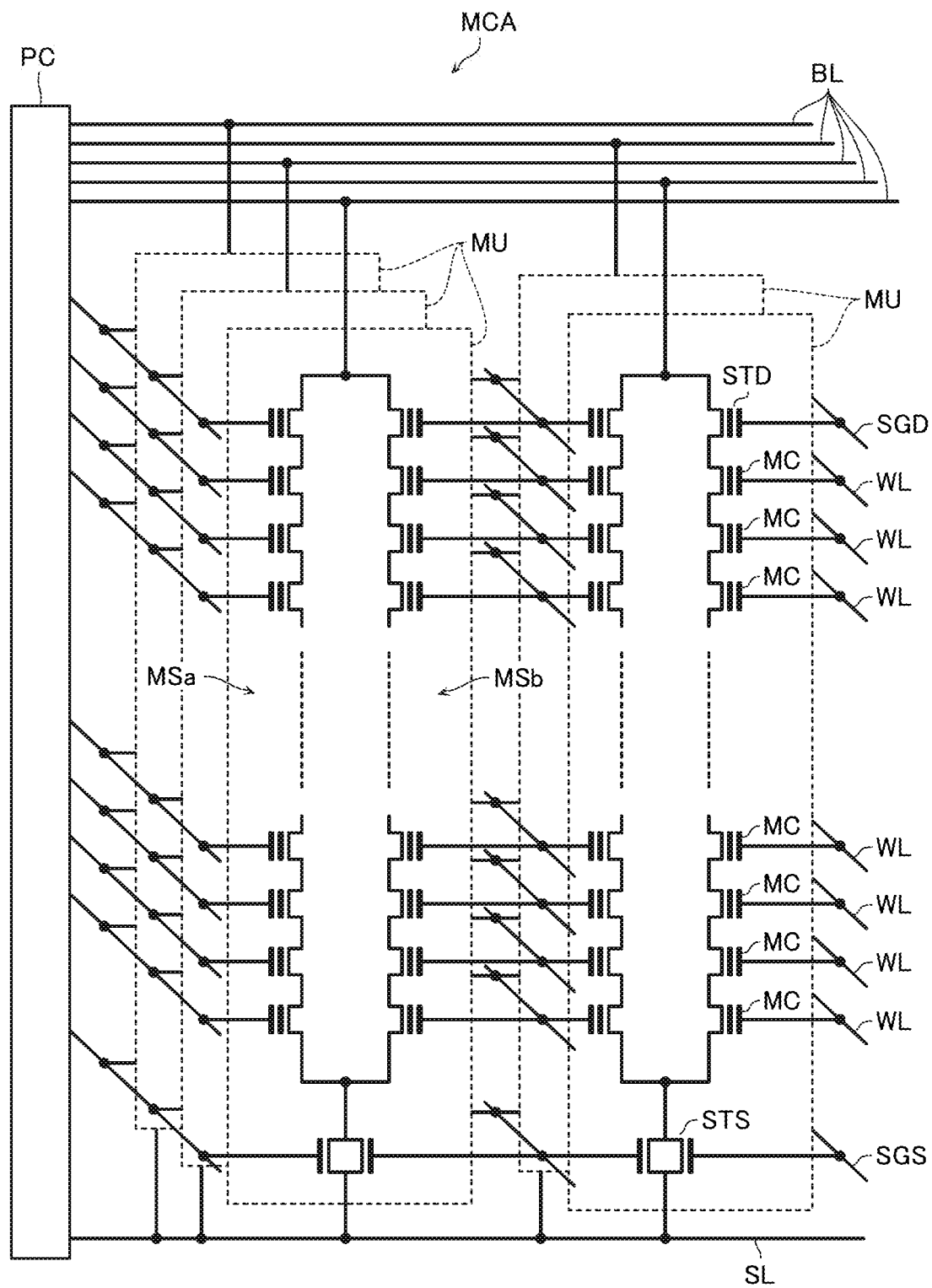
FIG. 1 is a schematic equivalent circuit diagram of a semiconductor memory device according to a first embodiment.

A semiconductor memory device according to one embodiment includes: a substrate; and a first memory layer disposed above the substrate in a first direction that intersects with a surface of the substrate. The first memory layer includes: a plurality of first conducting layers arranged in the first direction and extending in a second direction that intersects with the first direction; a plurality of first insulating layers disposed between the respective plurality of first conducting layers; a plurality of second conducting layers separated from the plurality of first conducting layers in a third direction that intersects with the first direction and the second direction, the plurality of second conducting layers being arranged in the first direction and extending in the second direction; a plurality of second insulating layers disposed between the respective plurality of second conducting layers; and a first semiconductor layer that includes a first part, a second part, and a third part, the first part extending in the first direction and opposing the plurality of first conducting layers and the plurality of first insulating layers, the second part extending in the first direction and opposing the plurality of second conducting layers and the plurality of second insulating layers, and the third part being connected to the first part and the second part and positioned farther from the substrate than the first part and the second part, and when: a cross-sectional surface extending in the second direction and the third direction and including at least a part of the third part is defined as a first cross-sectional surface; a region of the third part on one side in the third direction with respect to a first imaginary center line in the third direction in the first cross-sectional surface is defined as a first region, and a region on the other side is defined as a second region; the first imaginary center line is an imaginary line extending in the second direction and passing through a position at a half of a maximum width in a part where a width in the third direction of the third part in the first cross-sectional surface is maximum; and in the first cross-sectional surface, the third part has a maximum width in the second direction in the first region defined as a first width, the third part has a maximum width in the second direction in the second region defined as a second width, and the third part has a width in the second direction on the first imaginary center line defined as a third width, the third width is smaller than the first width, and the third width is smaller than the second width.

A semiconductor memory device according to one embodiment includes: a substrate; a first memory layer disposed above the substrate in a first direction that intersects with a surface of the substrate; and a second memory layer disposed above the first memory layer. The first memory layer includes: a plurality of first conducting layers arranged in the first direction and extending in a second direction that intersects with the first direction; a plurality of first insulating layers disposed between the respective plurality of first conducting layers; a plurality of second conducting layers separated from the plurality of first conducting layers in a third direction that intersects with the first direction and the second direction, the plurality of second conducting layers being arranged in the first direction and extending in the second direction; a plurality of second insulating layers disposed between the respective plurality of second conducting layers; and a first semiconductor layer that includes a first part, a second part, and a third part, the first part extending in the first direction and opposing the plurality of first conducting layers and the plurality of first insulating layers, the second part extending in the first direction and opposing the plurality of second conducting layers and the plurality of second insulating layers, and the third part being connected to the first part and the second part, and when: a distance in the third direction between a surface on one side in the third direction and a surface on the other side in the third direction of the first part is defined as a first distance; and a distance in the third direction between a surface on one side in the third direction and a surface on the other side in the third direction of the second part is defined as a second distance, a width in the third direction of the third part is larger than a sum of the first distance and the second distance.

A semiconductor memory device according to one embodiment includes: a substrate; a first memory layer disposed above the substrate in a first direction that intersects with a surface of the substrate; and a second memory layer disposed above the first memory layer in the first direction. The first memory layer includes: a plurality of first conducting layers arranged in the first direction and extending in a second direction that intersects with the first direction; a plurality of first insulating layers disposed between the respective plurality of first conducting layers; a plurality of second conducting layers separated from the plurality of first conducting layers in a third direction that intersects with the first direction and the second direction, the plurality of second conducting layers being arranged in the first direction and extending in the second direction; a plurality of second insulating layers disposed between the respective plurality of second conducting layers; a first semiconductor layer that includes a first part, a second part, and a third part, the first part extending in the first direction and opposing the plurality of first conducting layers and the plurality of first insulating layers, the second part extending in the first direction and opposing the plurality of second conducting layers and the plurality of second insulating layers, and the third part being connected to the first part and the second part; and a third insulating layer disposed between the first part and the second part and extending in the first direction and the second direction, the second memory layer includes: a plurality of third conducting layers arranged in the first direction and extending in the second direction; a plurality of fourth insulating layers disposed between the respective plurality of third conducting layers; a plurality of fourth conducting layers separated from the plurality of third conducting layers in the third direction, the plurality of fourth conducting layers being arranged in the first direction and extending in the second direction; a plurality of fifth insulating layers disposed between the respective plurality of fourth conducting layers; a second semiconductor layer that includes a fourth part, a fifth part, and a sixth part, the fourth part extending in the first direction and opposing the plurality of third conducting layers and the plurality of fourth insulating layers, the fifth part extending in the first direction and opposing the plurality of fourth conducting layers and the plurality of fifth insulating layers, and the sixth part being connected to the fourth part and the fifth part, and a sixth insulating layer disposed between the fourth part and the fifth part and extending in the first direction and the second direction, the sixth part is connected to the third part, the sixth insulating layer includes: a seventh part disposed on the first memory layer side with respect to the plurality of third conducting layers and the plurality of fourth conducting layers, the seventh part having a first width in the third direction; an eighth part disposed on the first memory layer side with respect to the seventh part, the eighth part having a second width in the third direction; and a ninth part disposed on the first memory layer side with respect to the eighth part, the ninth part having a third width in the third direction, the second width is larger than the first width, and the second width is larger than the third width.

Next, the semiconductor memory devices according to embodiments are described in detail with reference to the drawings. These embodiments are only examples, and not described for the purpose of limiting the present invention.

The drawings are schematic, and configurations and the like are partially omitted in some cases. Common reference numerals are attached to parts common to the embodiments, and the explanations are omitted in some cases.

In this specification, a direction parallel to a surface of a substrate is referred to as an X-direction, a direction parallel to the surface of the substrate and perpendicular to the X-direction is referred to as a Y-direction, and a direction perpendicular to the surface of the substrate is referred to as a Z-direction.

In this specification, a direction along a predetermined plane is referred to as a first direction, a direction intersecting with the first direction along this predetermined plane is referred to as a second direction, and a direction intersecting with this predetermined plane is referred to as a third direction in some cases. These first direction, second direction, and third direction may correspond to any of the X-direction, the Y-direction, and the Z-direction and need not to correspond to these directions.

Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion on the substrate side of this configuration. An upper surface and an upper end portion of a certain configuration mean a surface and an end portion on a side opposite to the substrate of this configuration. A surface intersecting with the X-direction or the Y-direction is referred to as a side surface and the like.

In this specification, when referring to a "width" or a "thickness" in a predetermined direction for a configuration, a member, and the like, it means a width or a thickness in a cross-sectional surface and the like observed by Scanning electron microscopy (SEM), Transmission electron microscopy (TEM), and the like in some cases.

First Embodiment

FIG. 1 is a schematic equivalent circuit diagram of a semiconductor memory device according to the first embodiment.

The semiconductor memory device according to the embodiment includes a memory cell array MCA and a peripheral circuit PC that controls the memory cell array MCA.

The memory cell array MCA includes a plurality of memory units MU. The plurality of memory units MU each include electrically independent two memory strings MSa, MSb. These memory strings MSa, MSb have one ends connected to respective drain-side selection transistors STD and connected to a common bit line BL via these STD. The memory strings MSa, MSb have the other ends connected to a common source-side selection transistor STS and connected to a common source line SL via the STS.

The memory strings MSa, MSb each include a plurality of memory cells MC connected to in series. The memory cell MC is a field-effect type transistor that includes a semiconductor layer, a gate insulating film, and a gate electrode. The semiconductor layer functions as a channel region. The gate insulating film includes an electric charge accumulating film configured to store data. The memory cell MC has a threshold voltage that varies depending on an electric charge amount in the electric charge accumulating film. The gate electrode is a part of a word line WL.

The selection transistor (STD, STS) is a field-effect type transistor that includes a semiconductor layer, a gate insulating film, and a gate electrode. The semiconductor layer functions as a channel region. The gate electrode of the drain-side selection transistor STD is a part of a drain-side selection gate line SGD. The gate electrode of the source-side selection transistor STS is a part of a source-side selection gate line SGS.

The peripheral circuit PC generates voltages necessary for a read operation, a write operation, an erase operation, and the like, and apply them to bit lines BL, a source line SL, word lines WL, and selection gate lines (SGD, SGS). The peripheral circuit PC includes circuits, such as a row decoder, a sense amplifier module, a voltage generation circuit, a sequencer, and various registers. The peripheral circuit PC includes, for example, a plurality of transistors and wirings disposed on a chip different from that of the memory cell array MCA.

[Memory Cell Array MCA]

Figure 2:
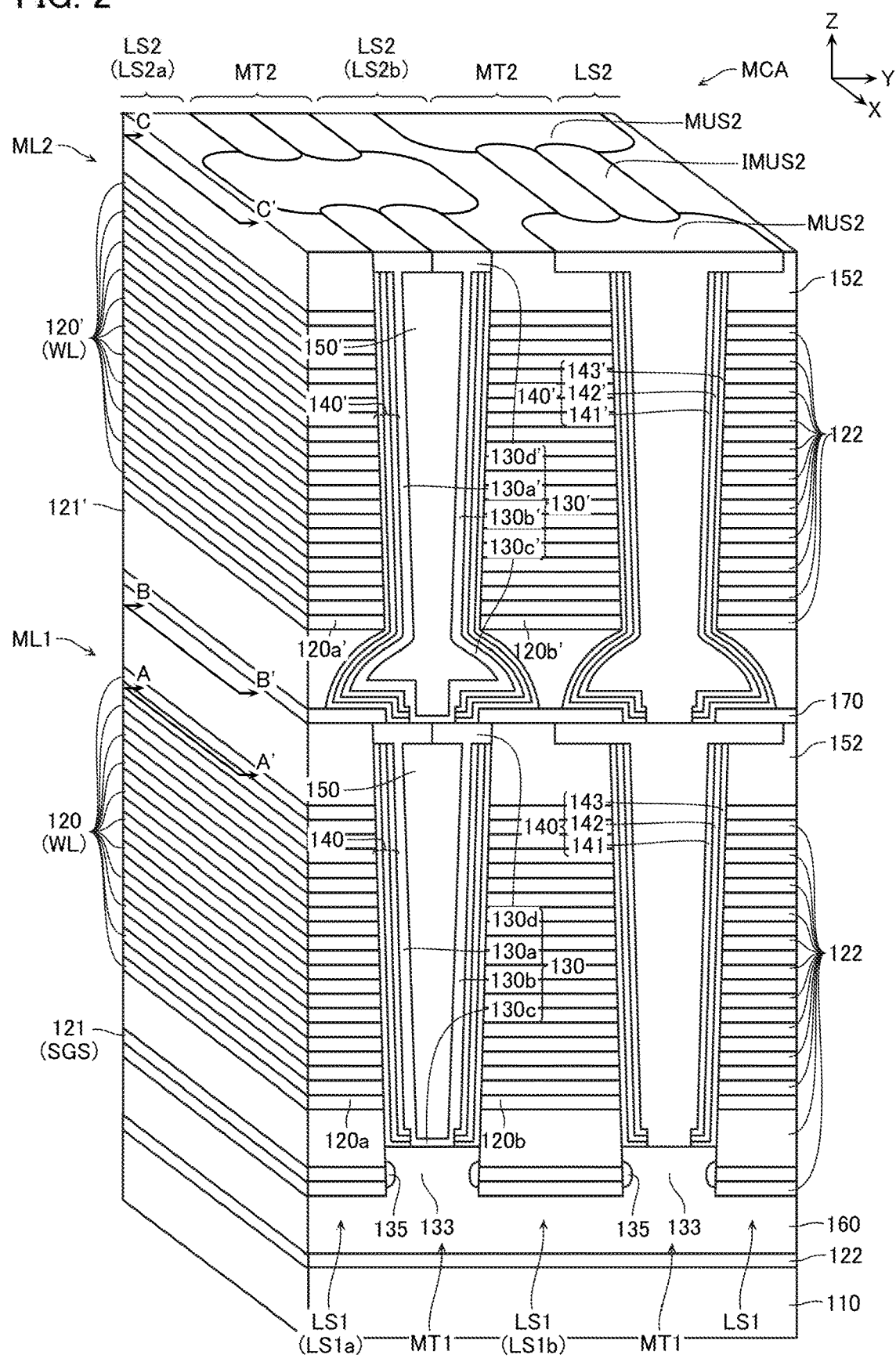
FIG. 2 is a schematic perspective view of the semiconductor memory device.
Figure 3A:
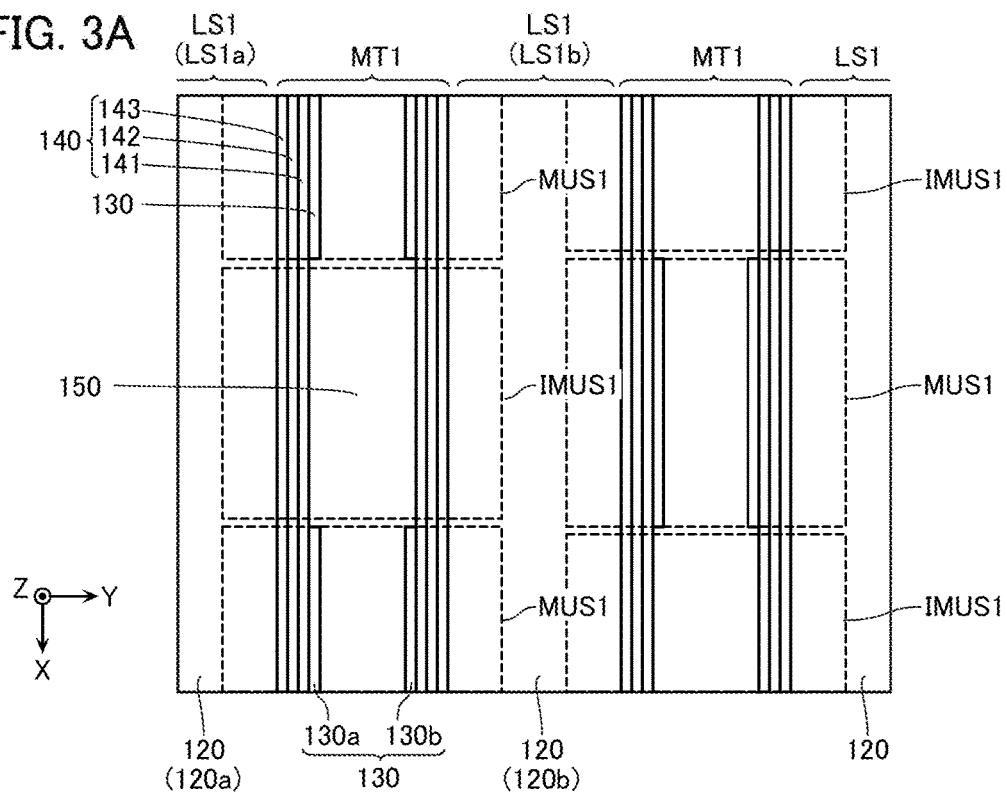
FIG. 3A is a schematic cross-sectional view corresponding to a line A-A' in FIG. 2.
Figure 3B:
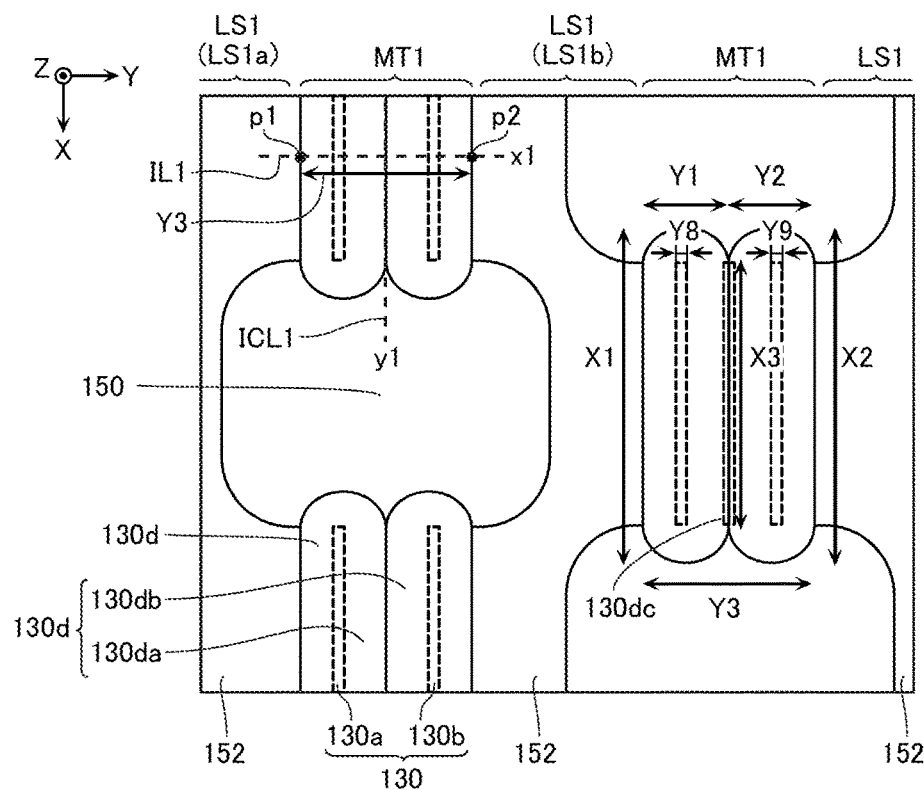
FIG. 3B is a schematic cross-sectional view corresponding to a line B-B' in FIG. 2.
Figure 3C:
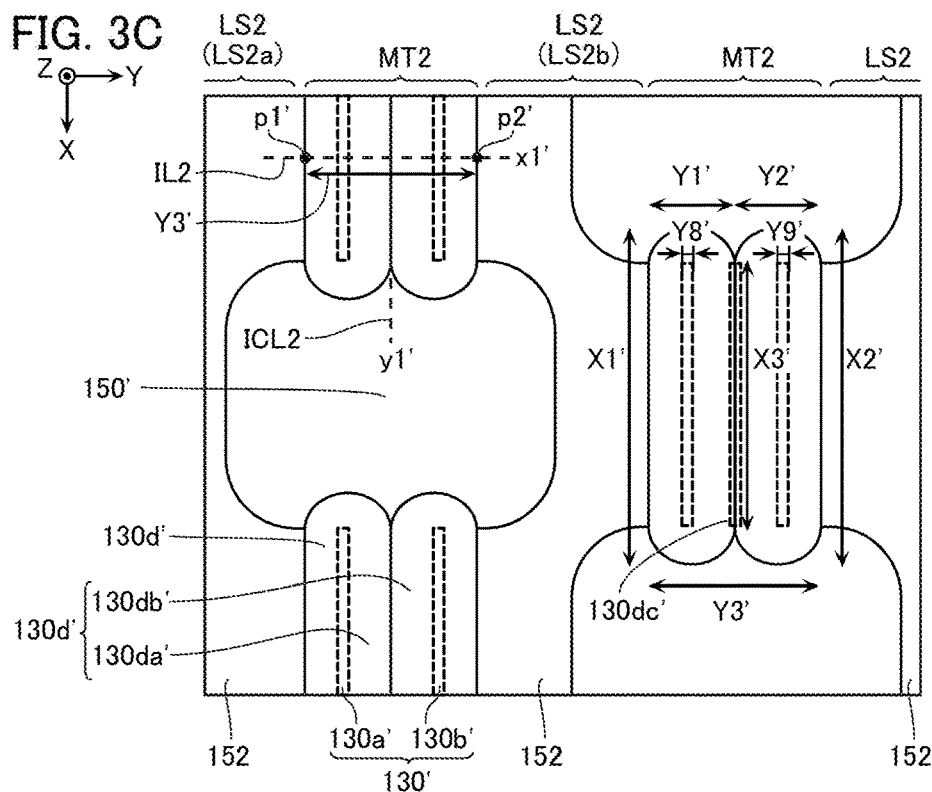
FIG. 3C is a schematic cross-sectional view corresponding to a line C-C' in FIG. 2.
Figure 4:
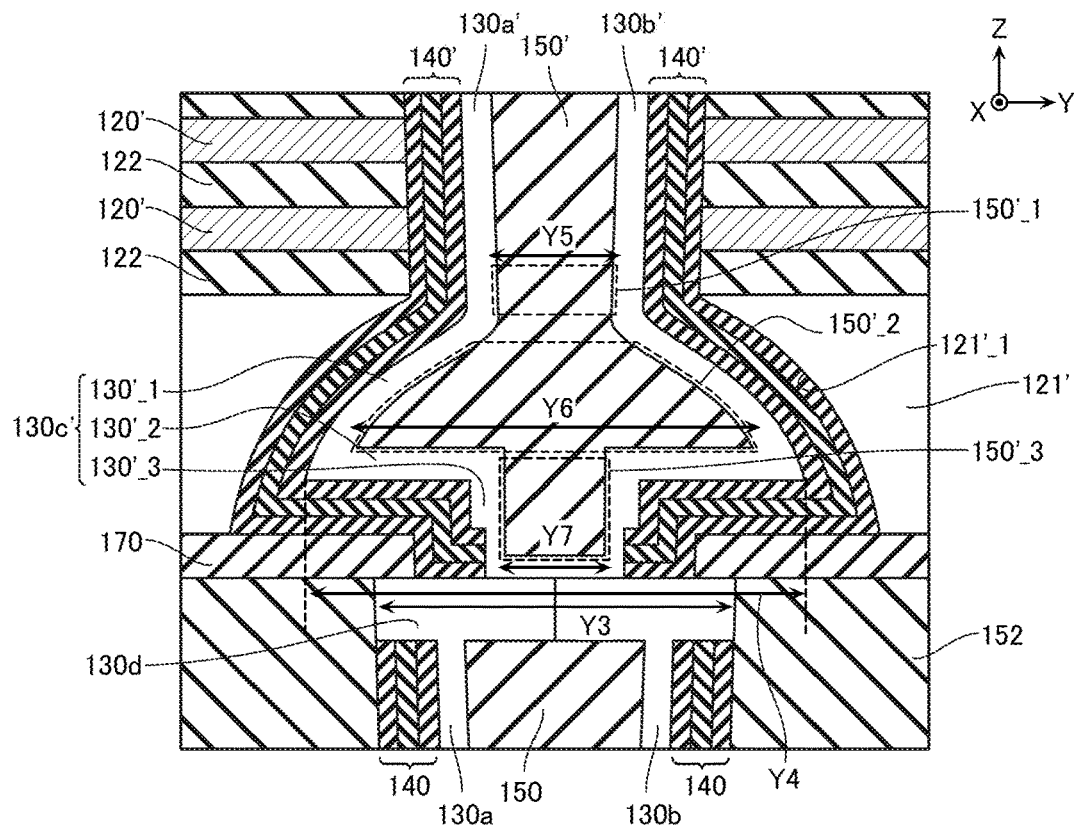
FIG. 4 is a schematic cross-sectional view of the semiconductor memory device.
Figure 5A:
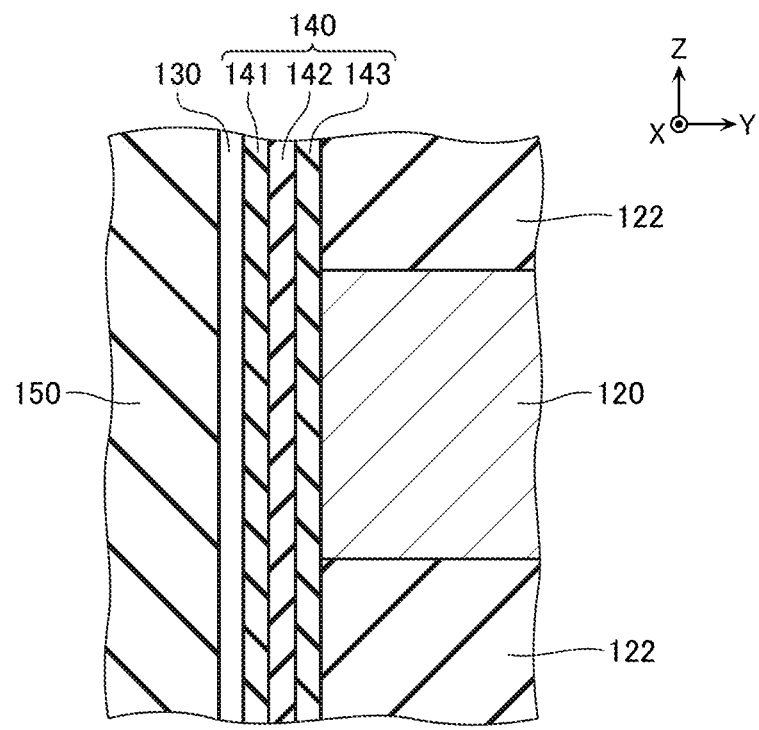
FIG. 5A is a schematic cross-sectional view of the semiconductor memory device.
Figure 5B:
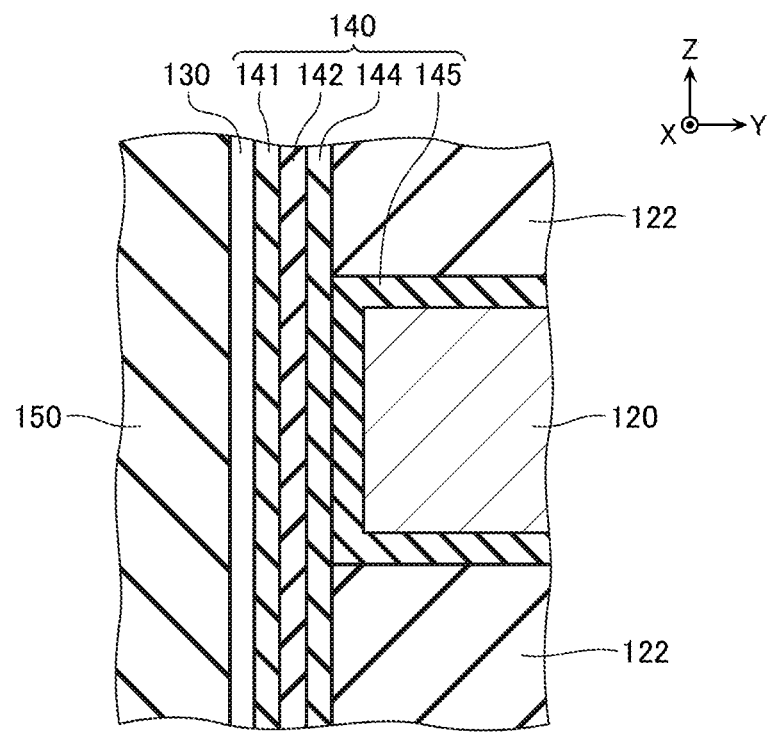
FIG. 5B is a schematic cross-sectional view of the semiconductor memory device.

Next, with reference to FIG. 2 to FIG. 5B, a schematic exemplary configuration of the semiconductor memory device according to the embodiment will be described. FIG. 2 is a schematic perspective view of the semiconductor memory device. FIG. 3A is a schematic cross-sectional view corresponding to a line A-A' in FIG. 2. FIG. 3B is a schematic cross-sectional view corresponding to a line B-B' in FIG. 2. FIG. 3C is a schematic cross-sectional view corresponding to a line C-C' in FIG. 2. FIG. 4 is an enlarged schematic cross-sectional view of a part of the configuration of FIG. 2. FIG. 5A and FIG. 5B are enlarged schematic cross-sectional views of a part of the configuration of FIG. 2. In FIG. 2 to FIG. 5B, the configuration is partially omitted.

For example, as illustrated in FIG. 2, the semiconductor memory device according to the embodiment includes a substrate 110 and a memory cell array MCA disposed above the substrate 110. The memory cell array MCA includes a first memory layer ML1 and a second memory layer ML2 disposed thereabove.

[Substrate 110]

The substrate 110 is a semiconductor substrate of single-crystal silicon (Si) or the like. The substrate 110 has, for example, a double well structure that includes an n-type impurity layer on an upper surface of the semiconductor substrate and further includes a p-type impurity layer in this n-type impurity layer. On the surface of the substrate 110, for example, the transistors, the wirings, and the like constituting the peripheral circuit PC may be disposed.

[First Memory Layer ML1]

The first memory layer ML1 includes a plurality of laminate structures LS1 arranged in the Y-direction. The laminate structure LS1 includes a plurality of conducting layers 120 laminated in the Z-direction. Between the laminate structures LS1, a memory trench structure MT1 is disposed. The laminate structures LS1 and the memory trench structures MT1 are alternately arranged in the Y-direction. For example, as illustrated in FIG. 3A, the memory trench structure MT1 includes a plurality of memory unit structures MUS1 and inter-memory unit structures IMUS1 arranged in the X-direction. The memory unit structure MUST includes a semiconductor layer 130, a part of a gate insulating film 140, and a part of an insulating layer 150. The inter-memory unit structure IMUS1 includes a part of the gate insulating film 140 and a part of the insulating layer 150. For example, as illustrated in FIG. 2, the semiconductor layer 130 has a lower end connected to a wiring layer 160.

The conducting layer 120 is an approximately plate-shaped conducting layer extending in the X-direction, and for example, a laminated film of titanium nitride (TiN) and tungsten (W) or a conducting layer of polycrystalline silicon (p-Si) to which impurities are injected or the like. The respective conducting layers 120 function as the word lines WL and the gate electrodes of the memory cells MC (FIG. 1).

Below the plurality of conducting layers 120, for example, a conducting layer 121 (FIG. 2) that contains a material similar to that of the conducting layer 120 is disposed. The conducting layer 121 functions as the source-side selection gate line SGS and the gate electrode of the source-side selection transistor STS (FIG. 1).

Insulating layers 122 of silicon oxide (SiO$_2$) or the like are disposed between the plurality of conducting layers 120, between the lowermost layer of the conducting layers 120 and the conducting layer 121, and between the conducting layer 121 and the wiring layer 160.

In the following description, one of the two laminate structures LS1 arranged in the Y-direction is referred to as a laminate structure LS1a, and the other is referred to as a laminate structure LS1b in some cases. The conducting layer 120 included in the laminate structure LS1a is referred to as a conducting layer 120a, and the conducting layer 120 included in the laminate structure LS1b is referred to as a conducting layer 120b in some cases.

For example, as illustrated in FIG. 3A, the semiconductor layers 130 are arranged in the X-direction corresponding to the plurality of memory unit structures MUST arranged in the X-direction. The semiconductor layer 130 is a semiconductor layer of non-doped polycrystalline silicon (Si) or the like. For example, as illustrated in FIG. 2, the semiconductor layer 130 includes a part 130a disposed between the laminate structure LS1a and the insulating layer 150, a part 130b disposed between the laminate structure LS1b and the insulating layer 150, a part 130c disposed at lower ends of the part 130a and the part 130b, and a part 130d disposed at upper ends of the part 130a and the part 130b.

The part 130a extends in the Z-direction and is opposed to the plurality of conducting layers 120a in the Y-direction. The part 130a functions as channel regions of the plurality of memory cells MC included in the memory string MSa (FIG. 1).

The part 130b extends in the Z-direction and is opposed to the plurality of conducting layers 120b in the Y-direction. The part 130b functions as channel regions of the plurality of memory cells MC included in the memory string MSb (FIG. 1).

For example, as illustrated in FIG. 3B, the part 130d includes a part 130da connected to the part 130a and a part 130db connected to the part 130b. These parts 130da, 130db each have an approximately oval shape extending in the X-direction and are mutually connected. In FIG. 3B, an imaginary center line ICL1 that passes through a center position y1 in the Y-direction of the part 130d and extends in the X-direction is set. In this case, the connecting portion between the parts 130da and 130db may approximately match, for example, this imaginary center line ICL1. These parts 130da, 130db may be, for example, a part positioned on one side (for example, left side in the example of FIG. 3B) in the Y-direction with respect to the imaginary center line ICL1 and a part positioned on the other side (for example, right side in the example of FIG. 3B) in the Y-direction with respect to the imaginary center line ICL1.

Note that the imaginary center line ICL1 may be set by, for example, the following method. For example, on a cross-sectional surface as illustrated in FIG. 3B, a position x1 in the X-direction at which the width in the Y-direction of the part 130d becomes a maximum width Y3 is determined. Subsequently, an imaginary line IL1 that passes through the position x1 and extends in the Y-direction is set. Subsequently, points p1, p2 at which the imaginary line IL1 intersects with a boundary line between the part 130d and an insulating layer 152 are set. Subsequently, a position in the Y-direction at a half (center position between the points p1 and p2) of the width Y3 from the point p1 toward the center side of the part 130d along the imaginary line IL1 is determined as a center position y1 in the Y-direction of the part 130d. Subsequently, an imaginary line that passes through the center position y1 and extends in the X-direction is set, and this imaginary line is determined as the imaginary center line ICL1.

The part 130da has a width Y1 in the Y-direction larger than a width Y8 in the Y-direction of the part 130a. The part 130db has a width Y2 in the Y-direction larger than a width Y9 in the Y-direction of the part 130b. In the illustrated example, the part 130da has a width in the X-direction that becomes a maximum width X1 at a position overlapping the part 130a viewed in the Z-direction. In the illustrated example, the part 130db has a width in the X-direction that becomes a maximum width X2 at a position overlapping the part 130b viewed in the Z-direction. The width in the X-direction of the part 130d becomes a minimum width X3 at a connecting portion 130dc between the parts 130da and 130db. The width X3 is smaller than the width X1 and the width X2. The width X1 and the width X2 are larger than widths in the X-direction of the part 130a and the part 130b. Note that, for example, as illustrated in FIG. 2, there is no interface layer between the part 130a and the part 130d. Similarly, there is no interface layer between the part 130b and the part 130d.

For example, as illustrated in FIG. 2, a semiconductor layer 133 is disposed below the semiconductor layer 130. The semiconductor layer 133 is connected to the part 130c of the semiconductor layer 130. There is an interface layer on a connecting portion between the semiconductor layer 133 and the part 130c of the semiconductor layer 130. The semiconductor layer 133 is disposed between the two conducting layers 121 mutually adjacent in the Y-direction, and opposed to the two conducting layers 121. The semiconductor layer 133 is a semiconductor layer of polycrystalline silicon (p-Si) or the like, and functions as a channel region of the source-side selection transistor STS (FIG. 1). An insulating layer 135 of silicon oxide (SiO$_2$) or the like is disposed between the semiconductor layer 133 and the conducting layer 121.

The gate insulating film 140 is disposed on both side surfaces in the Y-direction of the laminate structure LS1, and extend along the side surfaces in the X-direction and the Z-direction. For example, as illustrated in FIG. 5A, the gate insulating film 140 includes a tunnel insulating film 141, an electric charge accumulating film 142, and a block insulating film 143. The tunnel insulating film 141 and the block insulating film 143 are insulating films of silicon oxide (SiO$_2$) or the like. The electric charge accumulating film 142 is an insulating film of silicon nitride (SiN) or the like.

Note that the film included in the gate insulating film 140 may be partially or entirely disposed for each memory cell MC. For example, in the example illustrated in FIG. 5B, an insulating film 144 of silicon oxide (SiO$_2$) or the like and an insulating film 145 of alumina (Al$_2$O$_3$) or the like are disposed between the electric charge accumulating film 142 and the conducting layer 120, and the insulating films 144, 145 function as block insulating films. The insulating film 144 is commonly disposed for the plurality of memory cells MC arranged in the Z-direction. The insulating film 145 is disposed for each memory cell MC and covers the upper surface and the lower surface of the conducting layer 120.

As illustrated in FIG. 2, the gate insulating film 140 has a lower end connected to an upper surface of the semiconductor layer 133. The gate insulating film 140 has an upper end connected to the lower surface of the part 130d of the semiconductor layer 130.

The insulating layer 150 is disposed in the center in the Y-direction of the memory trench structure MT1, and extends in the X-direction and the Z-direction. For example, as illustrated in FIG. 3A, a width in the Y-direction of a part included in the memory unit structure MUST of the insulating layer 150 is smaller than a width in the Y-direction of a part included in the inter-memory unit structure IMUS1 of the insulating layer 150. The insulating layer 150 is an insulating layer of silicon oxide ($SiO_2$) or the like.

The wiring layer 160 (FIG. 2) is a plate-shaped conducting layer extending in the X-direction and the Y-direction. The wiring layer 160 is a conducting layer of, for example, a polycrystalline silicon (Si) into which impurities are injected, and functions as the source line SL (FIG. 1). Note that the structure of the source line SL is changeable as necessary. For example, the source line SL may be a part of the surface of the substrate 110. The source line SL may include a metal layer of titanium nitride (TiN), tungsten (W), or the like. The source line SL may be connected to the lower end of the semiconductor layer 130, or may be connected to the side surface in the Y-direction of the semiconductor layer 130.

[Second Memory Layer ML2]

For example, as illustrated in FIG. 2, the second memory layer ML2 includes a plurality of laminate structures LS2 arranged in the Y-direction. The laminate structure LS2 includes a plurality of conducting layers 120' laminated in the Z-direction. Between the laminate structures LS2, a memory trench structures MT2 is disposed. The laminate structures LS2 and the memory trench structures MT2 are alternately arranged in the Y-direction. The memory trench structure MT2 includes a plurality of memory unit structures MUS2 and inter-memory unit structures IMUS2 arranged in the X-direction. The memory unit structure MUS2 includes a semiconductor layer 130', a part of a gate insulating film 140', and a part of an insulating layer 150'. While the inter-memory unit structure IMUS2 includes a part of the gate insulating film 140' and a part of the insulating layer 150', the semiconductor layer 130' is not disposed.

The conducting layers 120' (FIG. 2) are basically formed similarly to the conducting layers 120. The respective conducting layers 120' function as the word lines WL and the gate electrodes of memory cells MC (FIG. 1) and the drain-side selection gate line SGD and the gate electrodes of the drain-side selection transistor STD (FIG. 1).

Below the plurality of conducting layers 120', a semiconductor layer 121' (FIG. 2) is disposed. The semiconductor layer 121' is, for example, a semiconductor layer of polycrystalline silicon (Si) into which N-type impurities, such as phosphorus (P), or P-type impurities, such as boron (B), are injected. For example, as illustrated in FIG. 4, the semiconductor layer 121' has an opposed surface 121'_1 to the semiconductor layer 130' formed as a depressed curved surface.

For example, as illustrated in FIG. 2, insulating layers 122 of silicon oxide ($SiO_2$) or the like are disposed between the plurality of conducting layers 120', and between the lowermost layer of the conducting layers 120' and the semiconductor layer 121'. An insulating layer 170 of silicon oxide ($SiO_2$) or the like is disposed between the semiconductor layer 121' and the first memory layer ML1. A part of an upper surface of the insulating layer 170 is connected to a lower surface of the semiconductor layer 121', and a part of the upper surface of the insulating layer 170 is connected to a lower end of the gate insulating film 140'.

In the following description, one of the two laminate structures LS2 arranged in the Y-direction is referred to as a laminate structure LS2*a*, and the other is referred to as a laminate structure LS2*b* in some cases. The conducting layer 120' included in the laminate structure LS2*a* is referred to as a conducting layer 120a', and the conducting layer 120' included in the laminate structure LS2*b* is referred to as a conducting layer 120b' in some cases.

The semiconductor layers 130' are arranged in the X-direction corresponding to the plurality of memory unit structures MUS2 arranged in the X-direction. The semiconductor layer 130' is a semiconductor layer of non-doped polycrystalline silicon (Si) or the like. The semiconductor layer 130' includes a part 130a' disposed between the laminate structure LS2*a* and the insulating layer 150', a part 130b' disposed between the laminate structure LS2*b* and the insulating layer 150', a part 130c' disposed at lower ends of the part 130a' and the part 130b', and a part 130d' disposed at upper ends of the part 130a' and the part 130b'.

The part 130a' extends in the Z-direction and is opposed to the plurality of conducting layers 120a' in the Y-direction. The part 130a' functions as channel regions of the plurality of memory cells MC included in the memory string MSa (FIG. 1), and a channel region of the drain-side selection transistor STD (FIG. 1) connected thereto.

The part 130b' extends in the Z-direction and is opposed to the plurality of conducting layers 120b' in the Y-direction. The part 130b' functions as channel regions of the plurality of memory cells MC included in the memory string MSb (FIG. 1), and a channel region of the drain-side selection transistor STD (FIG. 1) connected thereto.

For example, as illustrated in FIG. 4, the part 130c' includes a part 130'_1 connected to the lower ends of the part 130a' and the part 130b'. The part 130'_1 is formed in a curved plate shape along the opposed surface 121'_1 of the semiconductor layer 121'. In the illustrated example, the part 130'_1 has a width in the Y-direction increased toward the lower side, and the width becomes a maximum width Y4 at the lower end portion. For example, the width Y4 may be larger than the width Y3 in the Y-direction of the part 130d of the semiconductor layer 130. The part 130c' includes a part 130'_2 connected to the part 130'_1. The part 130'_2 extends in the Y-direction along the upper surface of the insulating layer 170. The part 130'_2 has one end portion in the Y-direction connected to the lower end of the part 130'_1. The part 130c' includes a part 130'_3 connected to the other end portion in the Y-direction of the part 130'_2. The part 130'_3 is connected to an upper surface of the part 130d of the semiconductor layer 130. There is an interface layer on a connecting portion between the part 130'_3 and the semiconductor layer 130. Meanwhile, there is no interface layer in a region from the part 130'_3 to the part 130a. Similarly, there is no interface layer in a region from the part 130'_3 to the part 130b.

For example, as illustrated in FIG. 3C, the part 130d' includes a part 130da' connected to the part 130a' and a part 130db' connected to the part 130b'. These parts 130da', 130db' each have an approximately oval shape extending in the X-direction and are mutually connected. In FIG. 3C, an imaginary center line ICL2 that passes through a center position y1' in the Y-direction of the part 130d' and extends in the X-direction is set. In this case, the connecting portion between the parts 130da' and 130db' may approximately match, for example, this imaginary center line ICL2. These parts 130da', 130db' may be, for example, a part positioned on one side (for example, left side in the example of FIG. 3C) in the Y-direction with respect to the imaginary center line ICL2 and a part positioned on the other side (for example, right side in the example of FIG. 3C) in the Y-direction with respect to the imaginary center line ICL2.

Note that the imaginary center line ICL2 may be set by, for example, the following method. For example, on a cross-sectional surface as illustrated in FIG. 3C, a position x1' in the X-direction at which the width in the Y-direction of the part 130*d*' becomes a maximum width Y3' is determined. Subsequently, an imaginary line IL2 that passes through the position x1' and extends in the Y-direction is set. Subsequently, points p1', p2' at which the imaginary line IL2 intersects with a boundary line between the part 130*d*' and the insulating layer 152 are set. Subsequently, a position in the Y-direction at a half (center position between the points p1' and p2') of the width Y3' from the point p1' toward the center side of the part 130*d*' along the imaginary line IL2 is determined as a center position y1' in the Y-direction of the part 130*d*'. Subsequently, an imaginary line that passes through the center position y1' and extends in the X-direction is set, and this imaginary line is determined as the imaginary center line ICL2.

The part 130*da*' has a width Y1' in the Y-direction larger than a width Y8' in the Y-direction of the part 130*a*'. The part 130*db*' has a width Y2' in the Y-direction larger than a width Y9' in the Y-direction of the part 130*b*'. In the illustrated example, the part 130*da*' has a width in the X-direction that becomes a maximum width X1' at a position overlapping the part 130*a*' viewed in the Z-direction. In the illustrated example, the part 130*db*' has a width in the X-direction that becomes a maximum width X2' at a position overlapping the part 130*b*' viewed in the Z-direction. The width in the X-direction of the part 130*d*' becomes a minimum width X3' at a connecting portion 130*dc*' between the parts 130*da*' and 130*db*'. The width X3' is smaller than the width X1' and the width X2'. The width X1' and the width X2' are larger than widths in the X-direction of the part 130*a*' and the part 130*b*'. Note that, for example, as illustrated in FIG. 2, there is no interface layer between the part 130*a*' and the part 130*d*'. Similarly, there is no interface layer between the part 130*b*' and the part 130*d*'.

For example, as illustrated in FIG. 2, the gate insulating film 140' is disposed on both side surfaces in the Y-direction of the laminate structure LS2, and extend along the side surfaces in the X-direction and the Z-direction. The gate insulating film 140' includes a tunnel insulating film 141', an electric charge accumulating film 142', and a block insulating film 143'. The tunnel insulating film 141' and the block insulating film 143' are insulating films of silicon oxide ($SiO_2$) or the like. The electric charge accumulating film 142' is an insulating film of silicon nitride (SiN) or the like.

Note that the film included in the gate insulating film 140' may be partially or entirely disposed for each memory cell MC.

For example, as illustrated in FIG. 4, in the gate insulating film 140', a part disposed between the opposed surface 121'_1 of the semiconductor layer 121' and the part 130'_1 of the semiconductor layer 130' is formed in a curved plate shape along the opposed surface 121'_1 of the semiconductor layer 121'. In the gate insulating film 140', a part disposed between the upper surface of the insulating layer 170 and the part 130'_2 of the semiconductor layer 130' extends in the Y-direction along the upper surface of the insulating layer 170. The lower end of the gate insulating film 140' is connected to the upper surface of the part 130*d* of the semiconductor layer 130. For example, as illustrated in FIG. 2, the gate insulating film 140' has an upper end connected to the lower surface of the part 130*d*' of the semiconductor layer 130'.

The insulating layer 150' is disposed in the center in the Y-direction of the memory trench structure MT2, and extends in the X-direction and the Z-direction. A width in the Y-direction of a part included in the memory unit structure MUS2 of the insulating layer 150' is smaller than a width in the Y-direction of a part included in the inter-memory unit structure IMUS2 of the insulating layer 150'. The insulating layer 150' is an insulating layer of silicon oxide ($SiO_2$) or the like.

For example, as illustrated in FIG. 4, the insulating layer 150' includes a part 150'_1 disposed below the conducting layer 120', a part 150'_2 disposed below the part 150'_1, and a part 150'_3 disposed below the part 150'_2. In the illustrated example, the part 150'_2 has a width in the Y-direction increased toward the lower side, and the width becomes a maximum width Y6 at the lower end portion. The width Y6 is larger than a width Y5 in the Y-direction of the part 150'_1 and a width Y7 in the Y-direction of the part 150'_3. The width Y5 in the Y-direction of the part 150'_1 may be larger than the width Y7 in the Y-direction of the part 150'_3, or may be almost same. Note that the width Y5 in the Y-direction of the part 150'_1 and the width Y7 in the Y-direction of the part 150'_3 are smaller than the width Y3 in the Y-direction of the part 130*d* of the semiconductor layer 130. The width Y6 in the Y-direction of the part 150'_2 may be larger than the width Y3 in the Y-direction of the part 130*d* of the semiconductor layer 130, or may be smaller than it.

[Manufacturing Method]

Figure 6A:
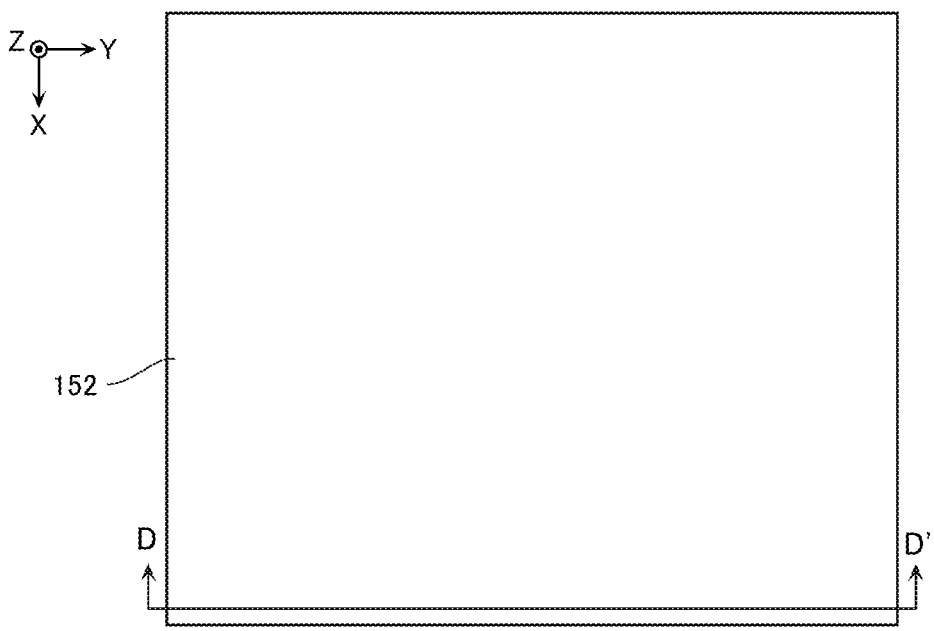
FIGS. 6A and 6B are schematic plan view and cross-sectional view illustrating a method for manufacturing the semiconductor memory device.
Figure 6B:
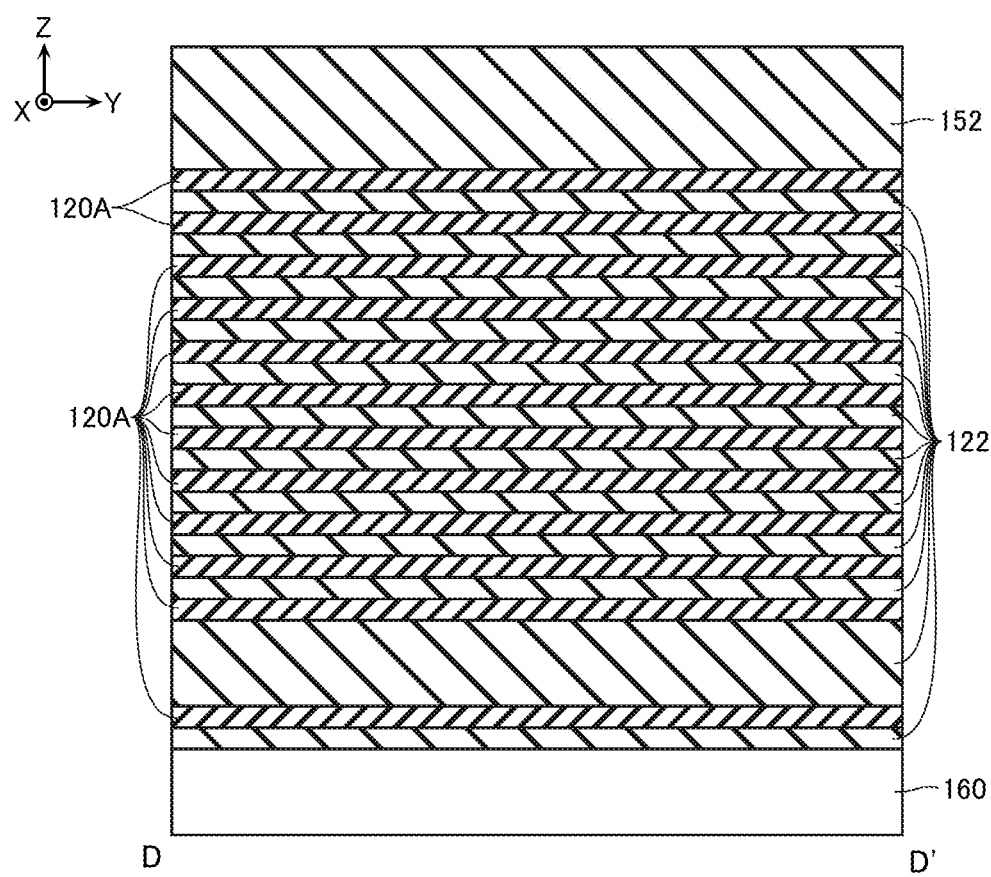
Figure 7A:
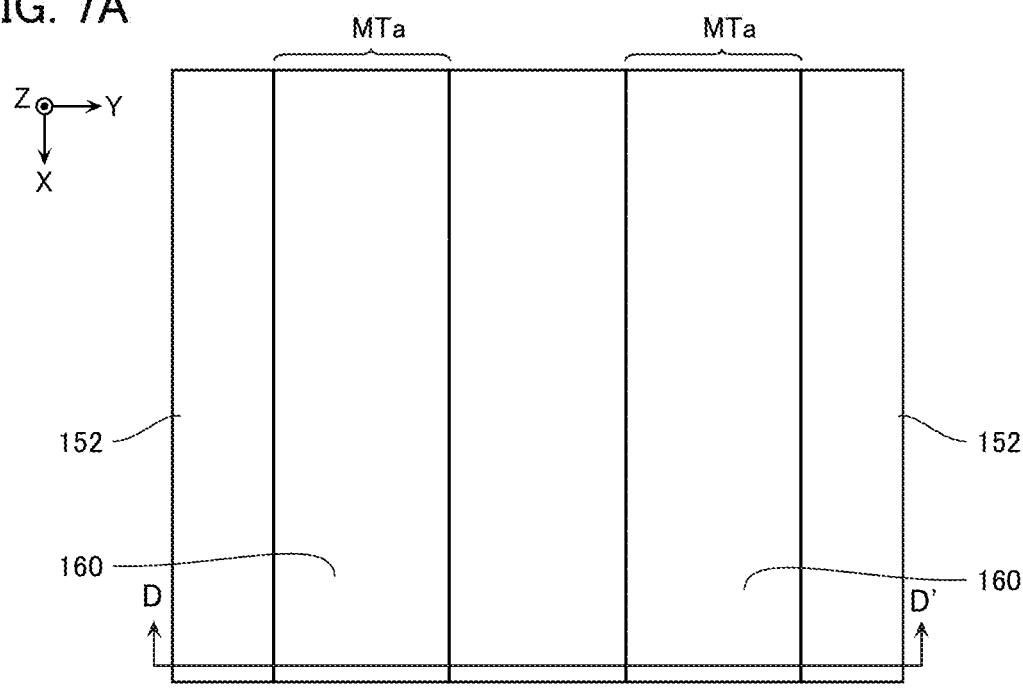
FIGS. 7A and 7B are schematic plan view and cross-sectional view illustrating the manufacturing method.
Figure 7B:
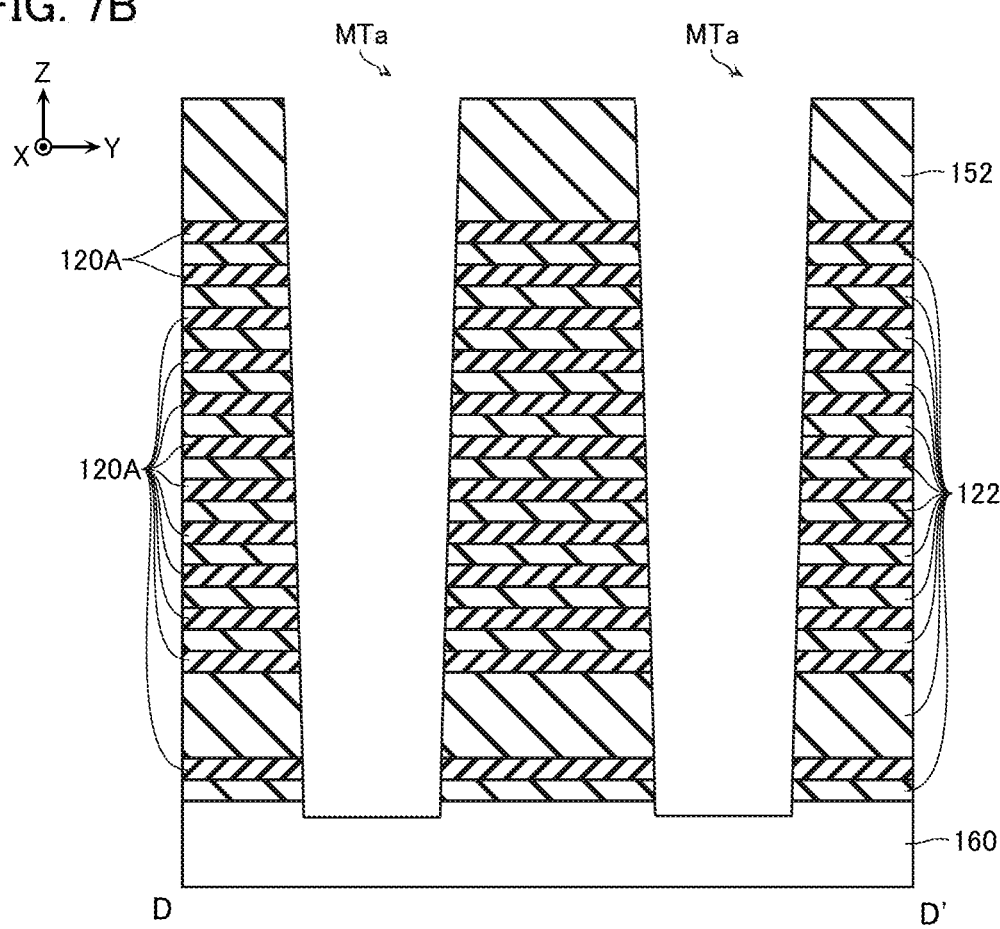

Next, with reference to FIG. 6A to FIG. 36, a method for manufacturing the semiconductor memory device according to the embodiment will be described. FIGS. 6A, 7A, . . . , 19A are schematic plan views for describing the manufacturing method. FIGS. 6B, 7B, . . . , 19B are schematic cross-sectional views for describing the manufacturing method, and illustrate cross-sectional surfaces corresponding to lines D-D' in FIGS. 6A, 7A, . . . , 19A. FIG. 20 to FIG. 36 are schematic cross-sectional views of structures in a manufacturing process, and illustrate the cross-sectional surface illustrated in FIG. 2.

As illustrated in FIGS. 6A and 6B, in the manufacturing method, the wiring layer 160 is formed above a substrate (not illustrated). A plurality of insulating layers 122 and sacrificial layers 120A are laminated in alternation on the upper surface of the wiring layer 160. The insulating layer 152 is formed on an upper surface of the uppermost layer of the sacrificial layers 120A. The sacrificial layer 120A contains silicon nitride (SiN) or the like. The insulating layer 152 contains silicon oxide ($SiO_2$) or the like. The film formations of the wiring layer 160, the insulating layer 122, the sacrificial layer 120A, and the insulating layer 152 are performed by Chemical Vapor Deposition (CVD) or the like.

Subsequently, as illustrated in FIGS. 7A and 7B, openings MTa are formed to the insulating layers 122, the sacrificial layers 120A, and the insulating layer 152. The openings MTa are formed by, for example, forming an insulating layer having openings at positions corresponding to the openings MTa on the upper surface of the structure illustrated in FIGS. 6A and 6B and performing Reactive Ion Etching (RIE) or the like using the insulating layer as a mask.

The opening MTa extends in the Z-direction, separates the insulating layers 122, the sacrificial layers 120A, and the insulating layer 152 in the Y-direction, and causes the upper surface of the wiring layer 160 to be exposed.

Figure 8A:
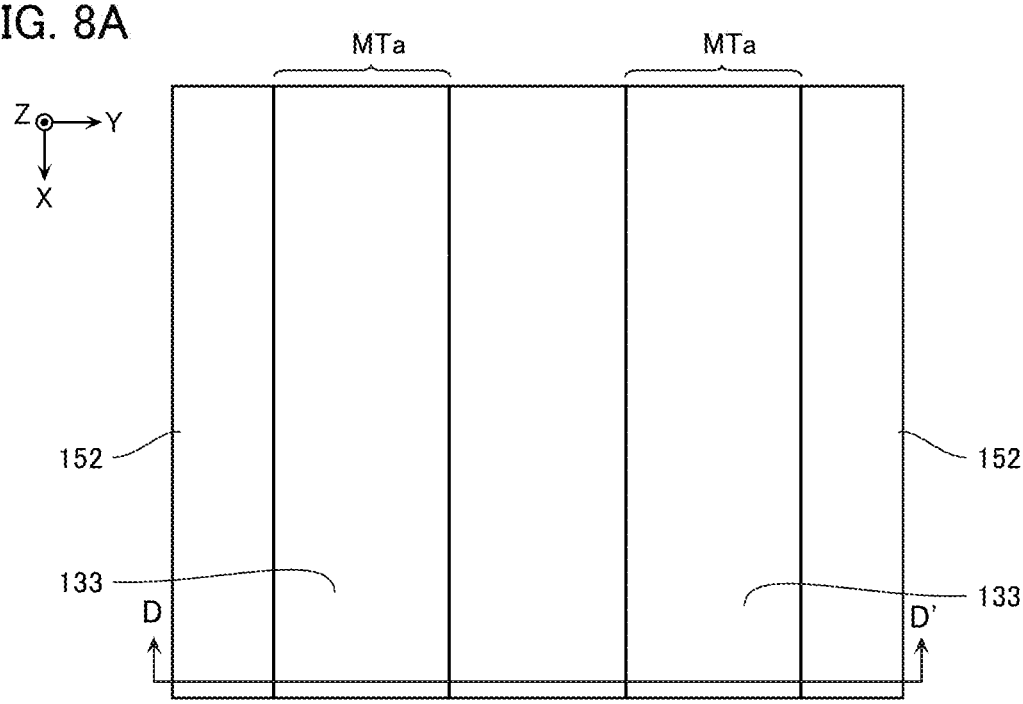
FIGS. 8A and 8B are schematic plan view and cross-sectional view illustrating the manufacturing method.
Figure 8B:
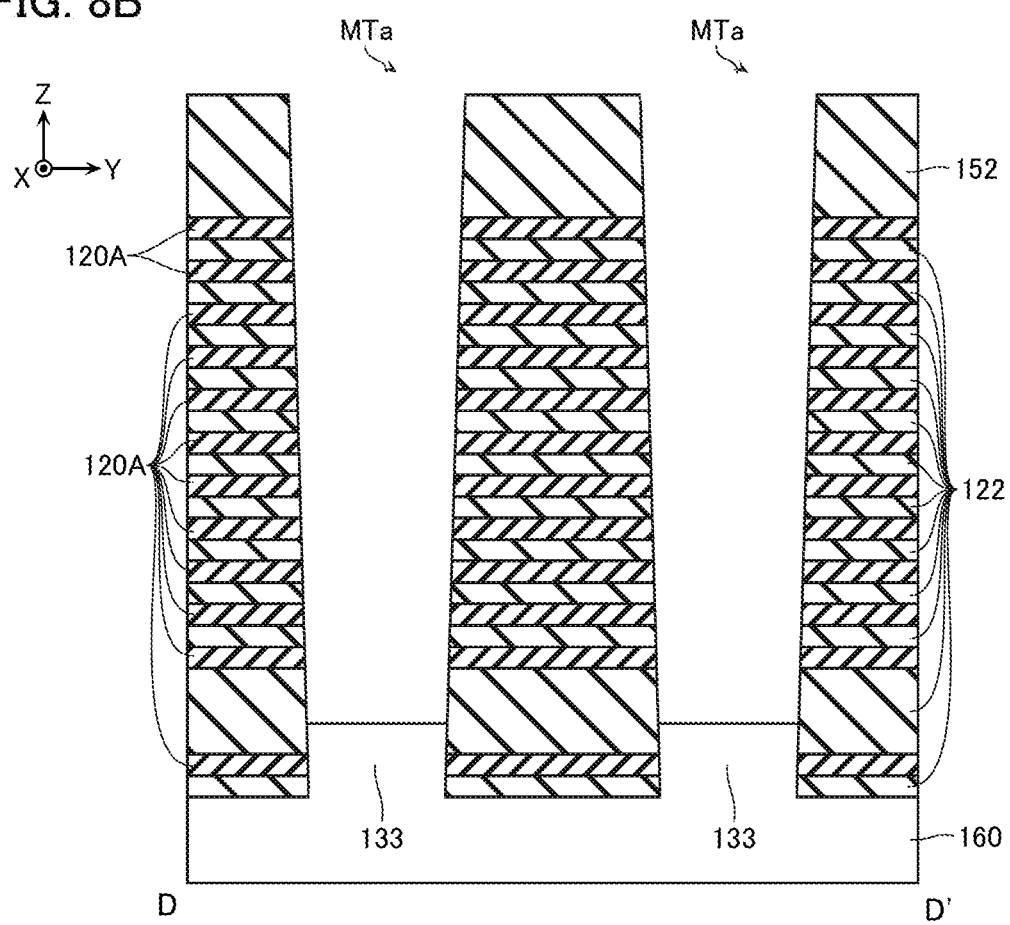

Subsequently, as illustrated in FIGS. 8A and 8B, the semiconductor layer 133 is formed on bottom surfaces of the openings MTa. The semiconductor layer 133 is formed by an epitaxial growth or the like.

Figure 9A:
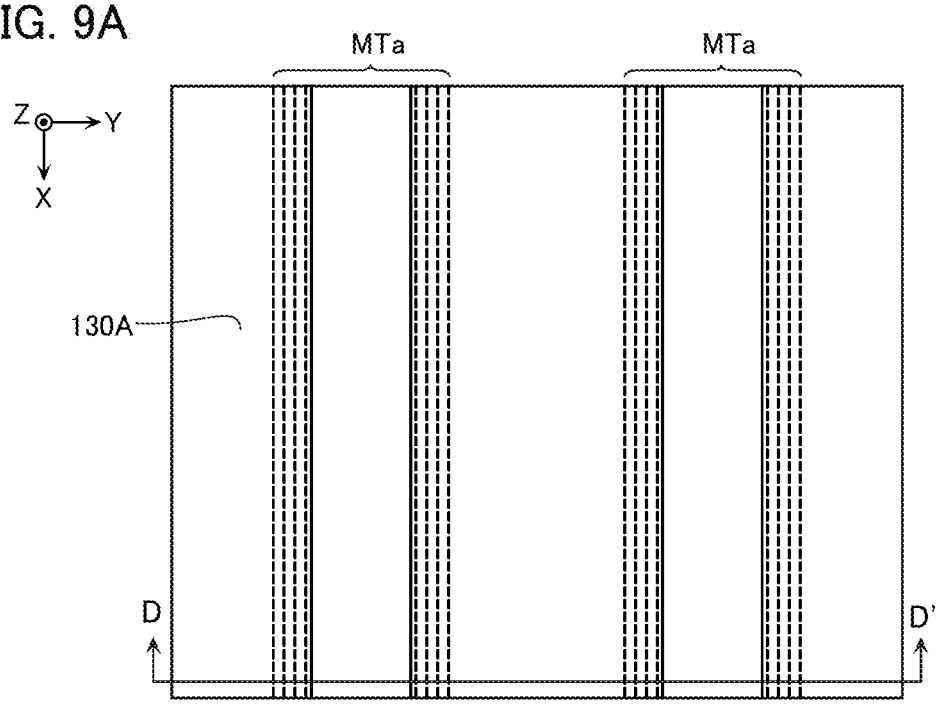
FIGS. 9A and 9B are schematic plan view and cross-sectional view illustrating the manufacturing method.
Figure 9B:
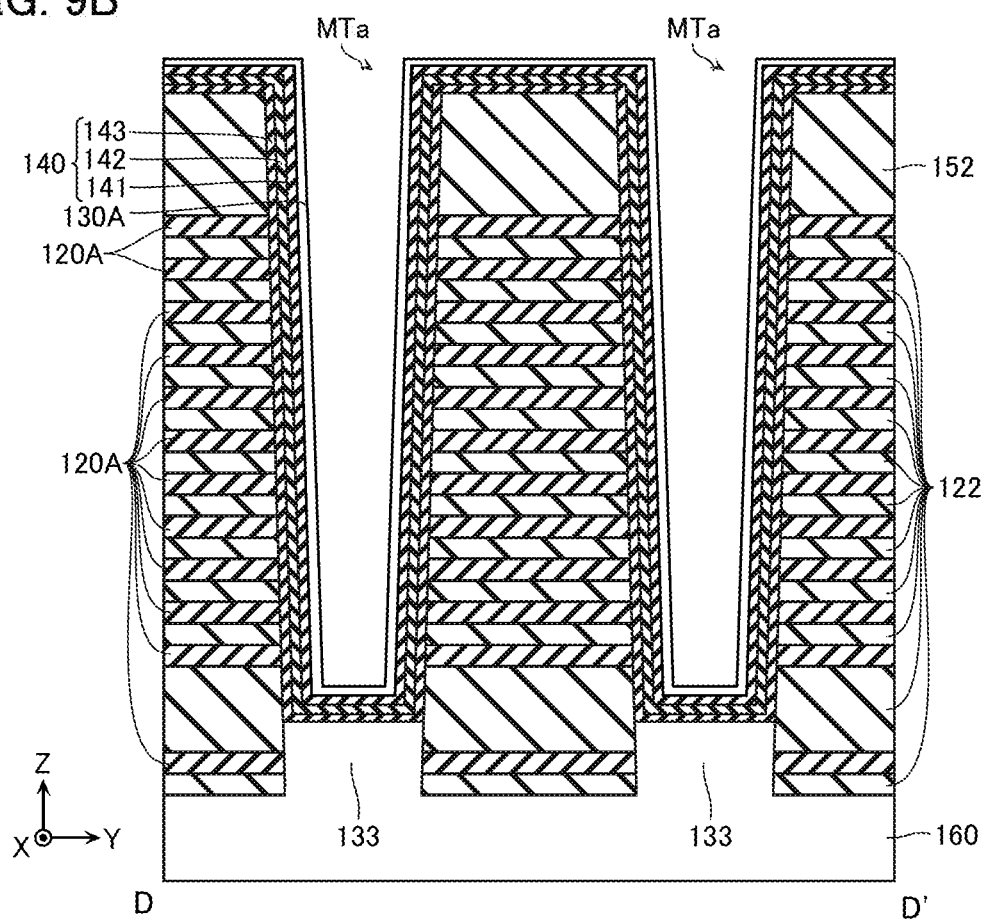

Subsequently, as illustrated in FIGS. 9A and 9B, the block insulating film 143, the electric charge accumulating film 142, the tunnel insulating film 141, and an amorphous silicon film 130A are formed on the upper surface of the insulating layer 152 and the bottom surfaces and the side surfaces of the openings MTa. This process is performed by a method, such as CVD.

Figure 10A:
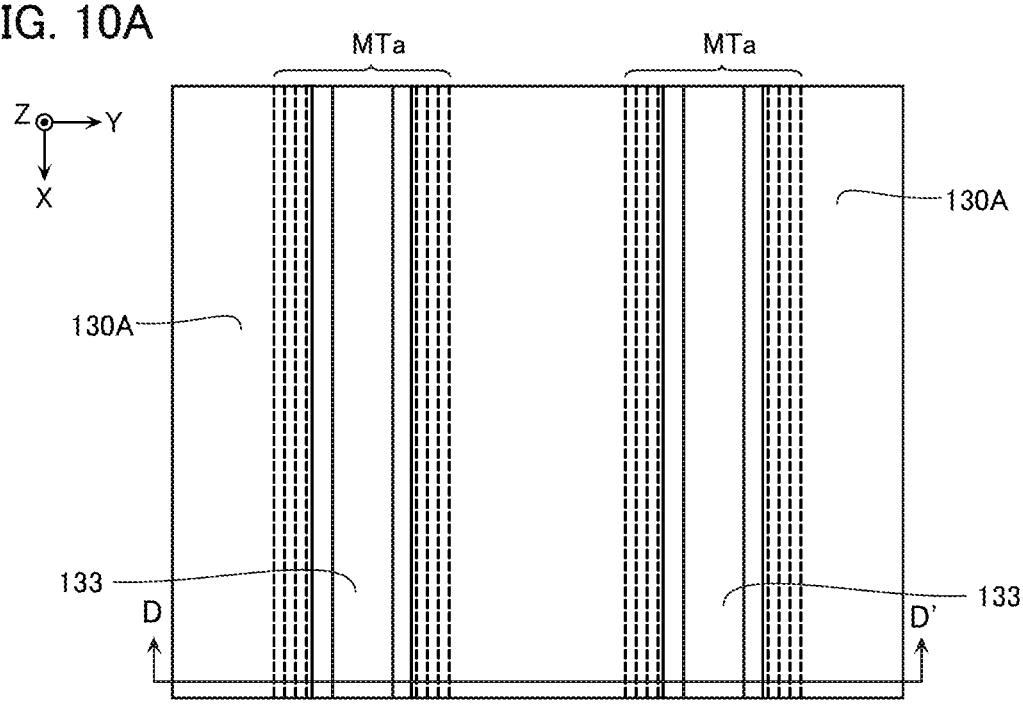
FIGS. 10A and 10B are schematic plan view and cross-sectional view illustrating the manufacturing method.
Figure 10B:
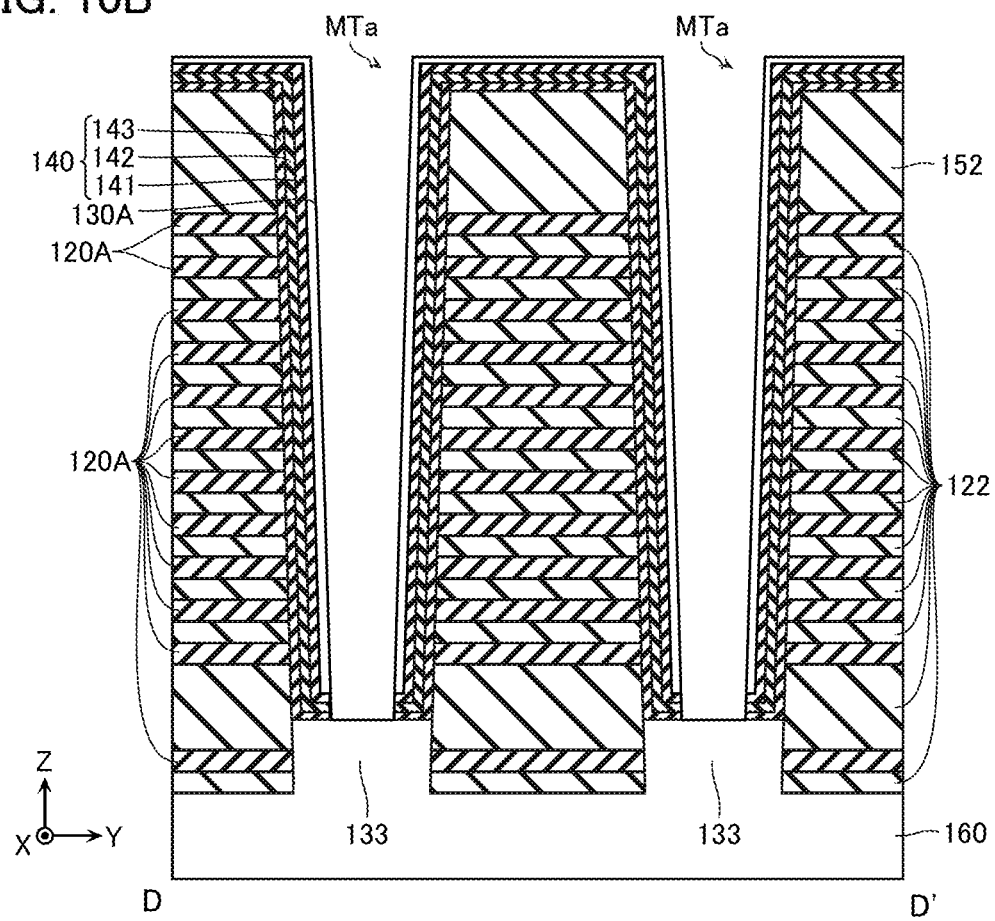

Subsequently, as illustrated in FIGS. 10A and 10B, in the block insulating film 143, the electric charge accumulating film 142, the tunnel insulating film 141, and the amorphous silicon film 130A, the parts disposed on the bottom surface portions of the openings MTa are removed, and causes the semiconductor layer 133 to be exposed. This process is performed by RIE or the like.

Figure 11A:
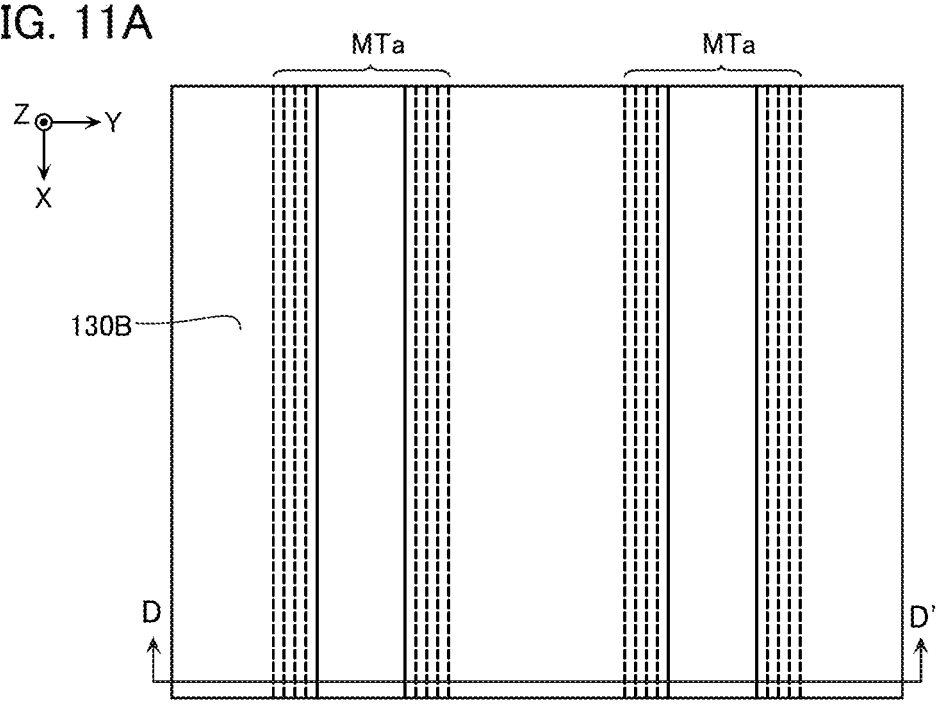
FIGS. 11A and 11B are schematic plan view and cross-sectional view illustrating the manufacturing method.
Figure 11B:
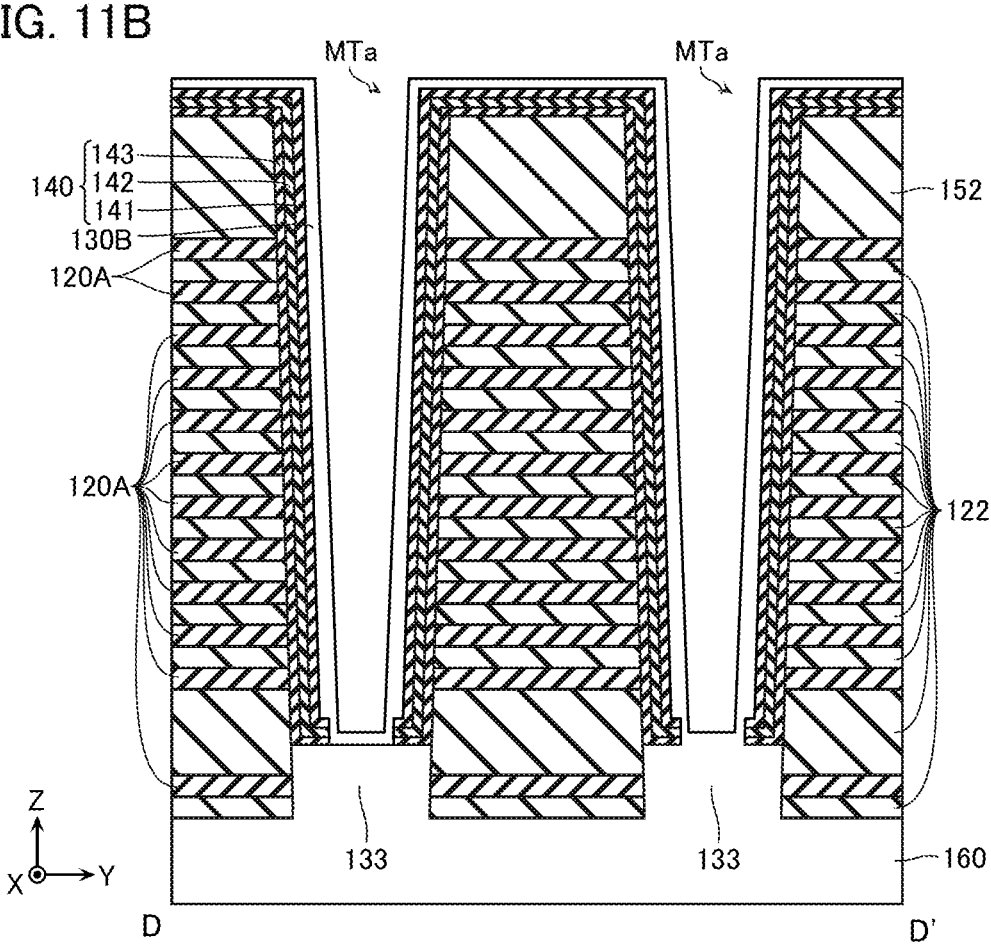

Subsequently, as illustrated in FIGS. 11A and 11B, an amorphous silicon film is formed on the upper surface of the semiconductor layer 133 and side surfaces and upper surfaces of the amorphous silicon film 130A. This process is performed by a method, such as CVD. Subsequently, a heat treatment or the like is performed to modify a crystalline structure of the amorphous silicon film 130A, thus forming a semiconductor layer 130B of polycrystalline silicon (Si) or the like.

Figure 12A:
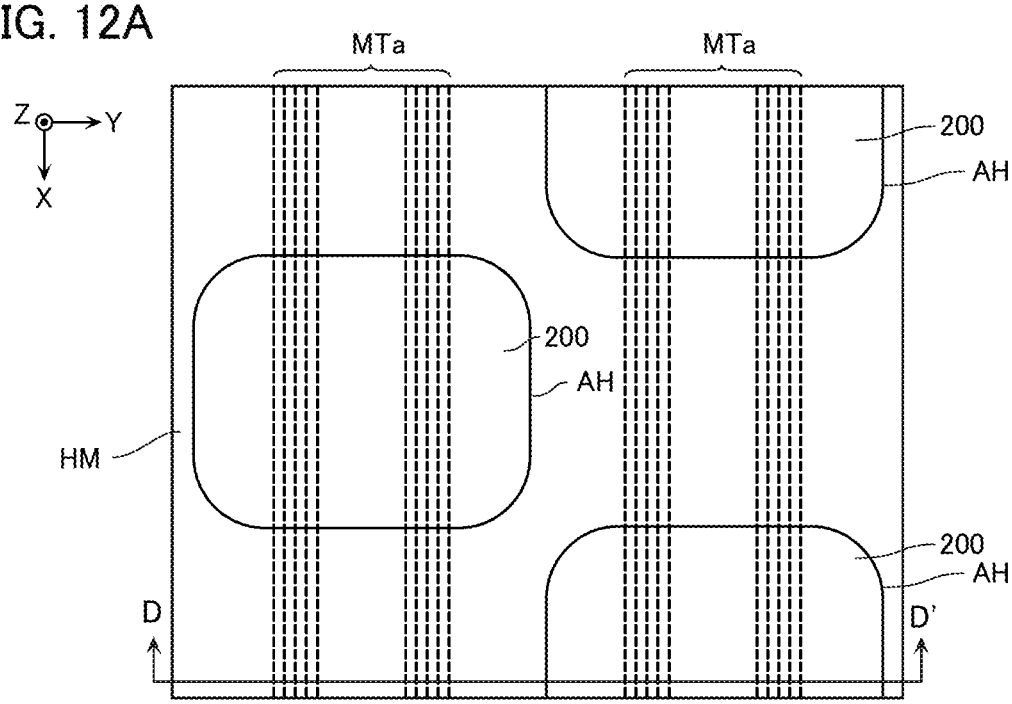
FIGS. 12A and 12B are schematic plan view and cross-sectional view illustrating the manufacturing method.
Figure 12B:
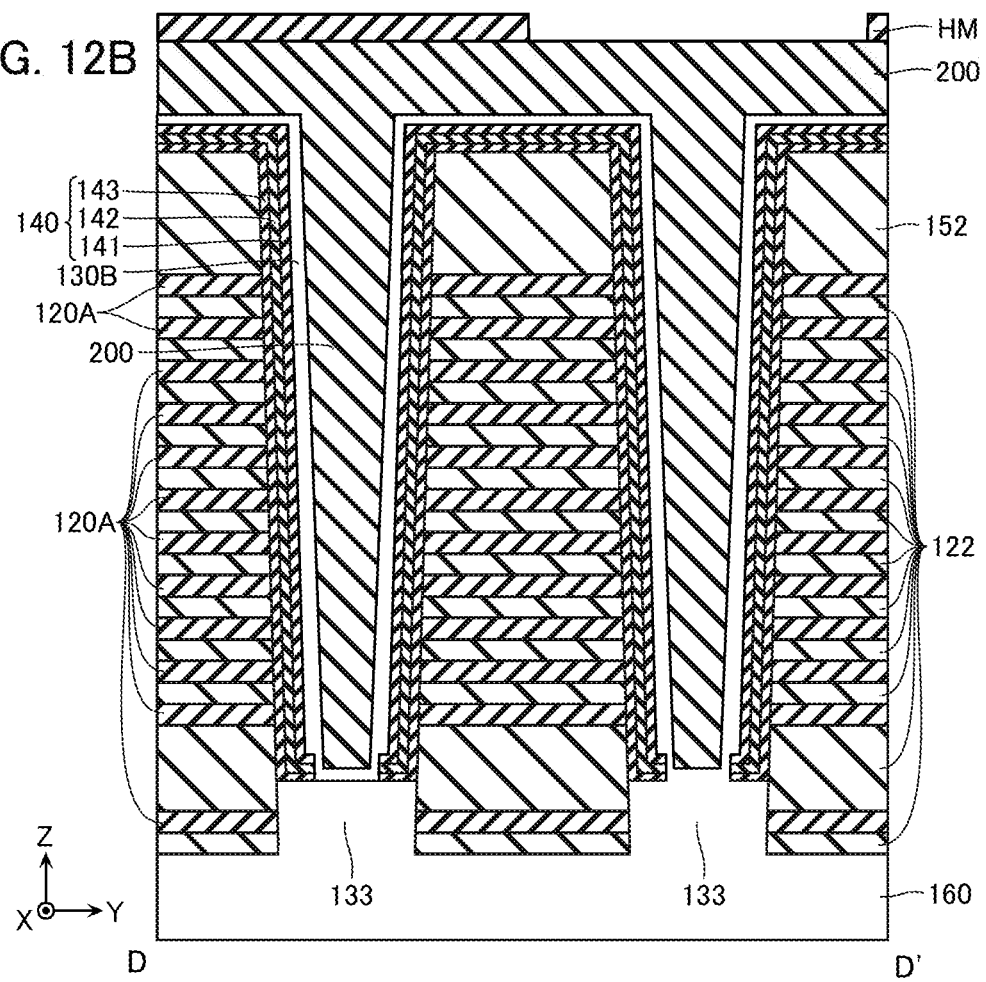

Subsequently, as illustrated in FIGS. 12A and 12B, a carbon film 200 is formed inside the openings MTa, and subsequently, a hard mask HM of an oxide film or the like is formed on an upper surface of the carbon film 200. The formation of the carbon film 200 is performed by, for example, spin coating of a coating type carbon film material. The formation of the hard mask HM is performed by CVD or the like.

Subsequently, as illustrated in FIGS. 12A and 12B, openings AH are provided to the hard mask HM. The openings AH are provided at positions corresponding to the inter-memory unit structures IMUS1 (FIG. 3). The formation of the openings AH is performed by a method, such as photolithography and wet etching.

Figure 13A:
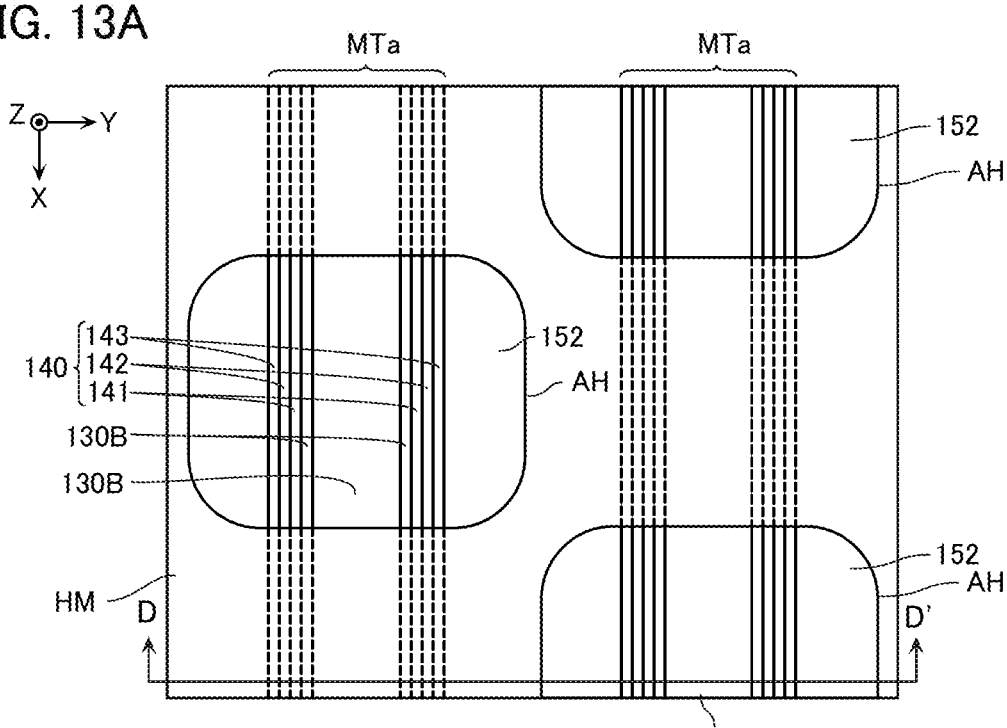
FIGS. 13A and 13B are schematic plan view and cross-sectional view illustrating the manufacturing method.
Figure 13B:
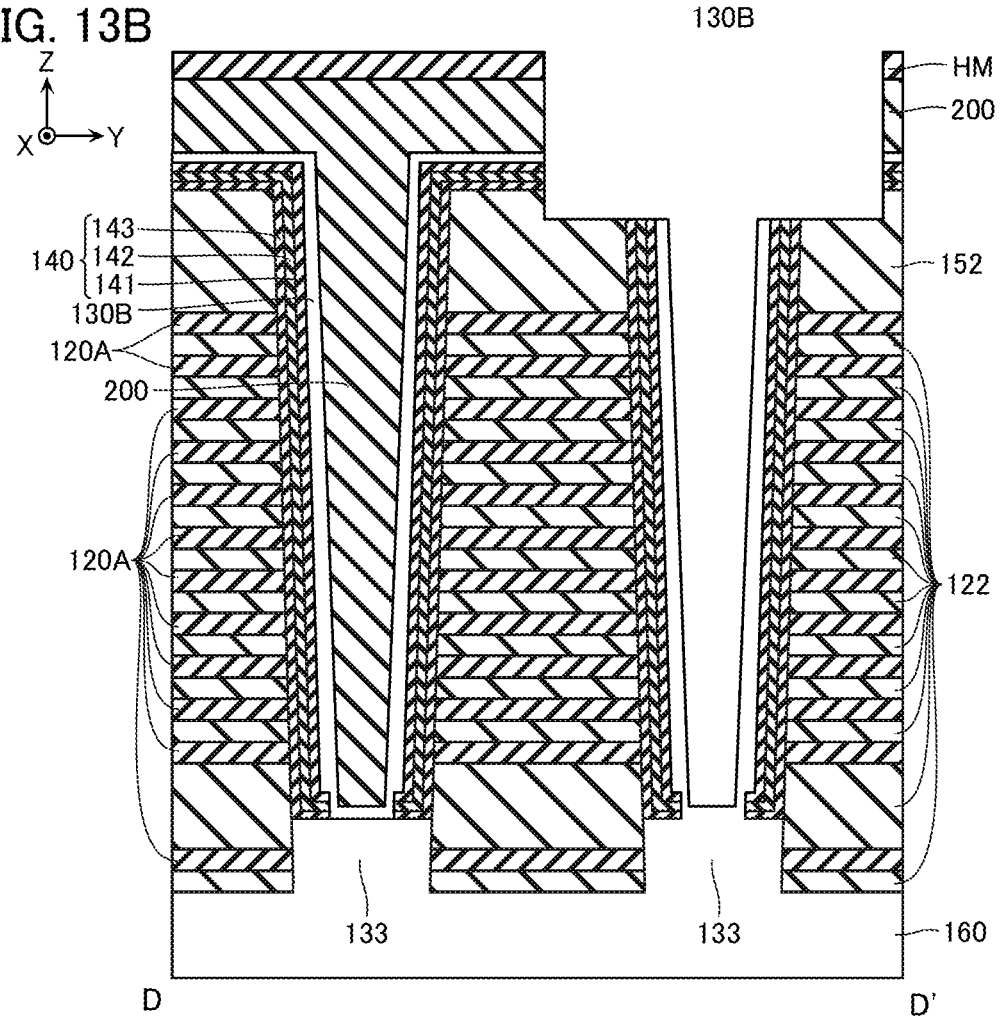

Subsequently, as illustrated in FIGS. 13A and 13B, the parts of the carbon film 200 disposed at the positions corresponding to the openings AH are removed. This process is performed by RIE or the like. Note that in this process, apart of the semiconductor layer 130B, apart of the tunnel insulating film 141, a part of the electric charge accumulating film 142, and a part of the block insulating film 143 are also removed, and a part of the insulating layer 152 is exposed.

Figure 14A:
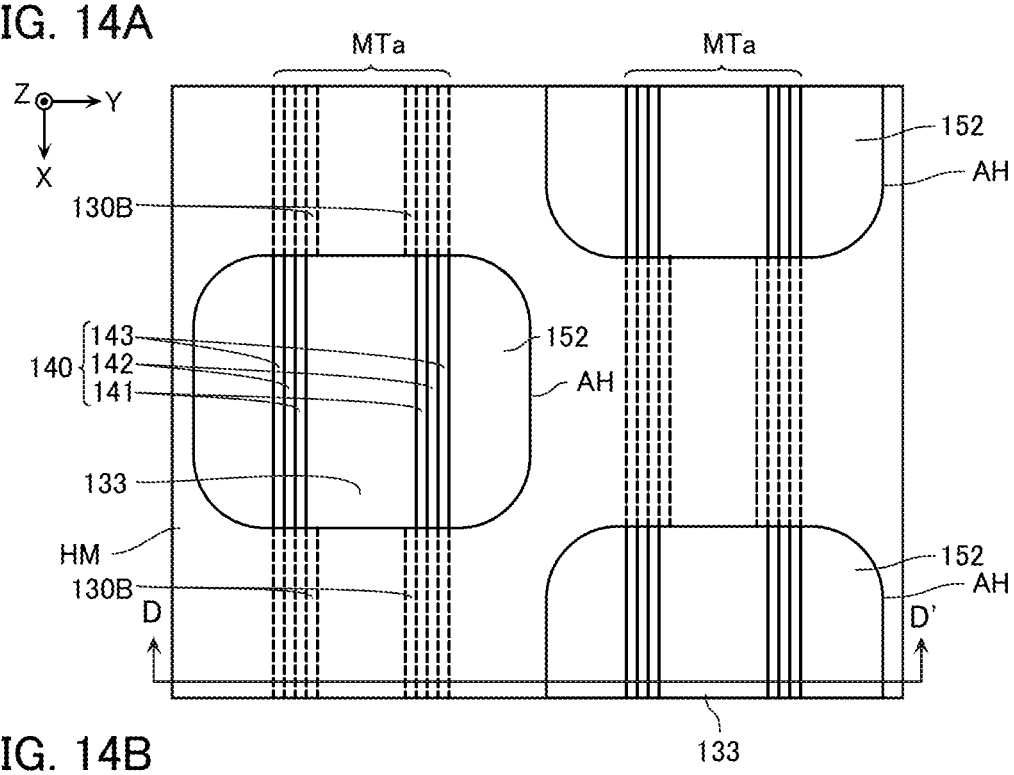
FIGS. 14A and 14B are schematic plan view and cross-sectional view illustrating the manufacturing method.
Figure 14B:
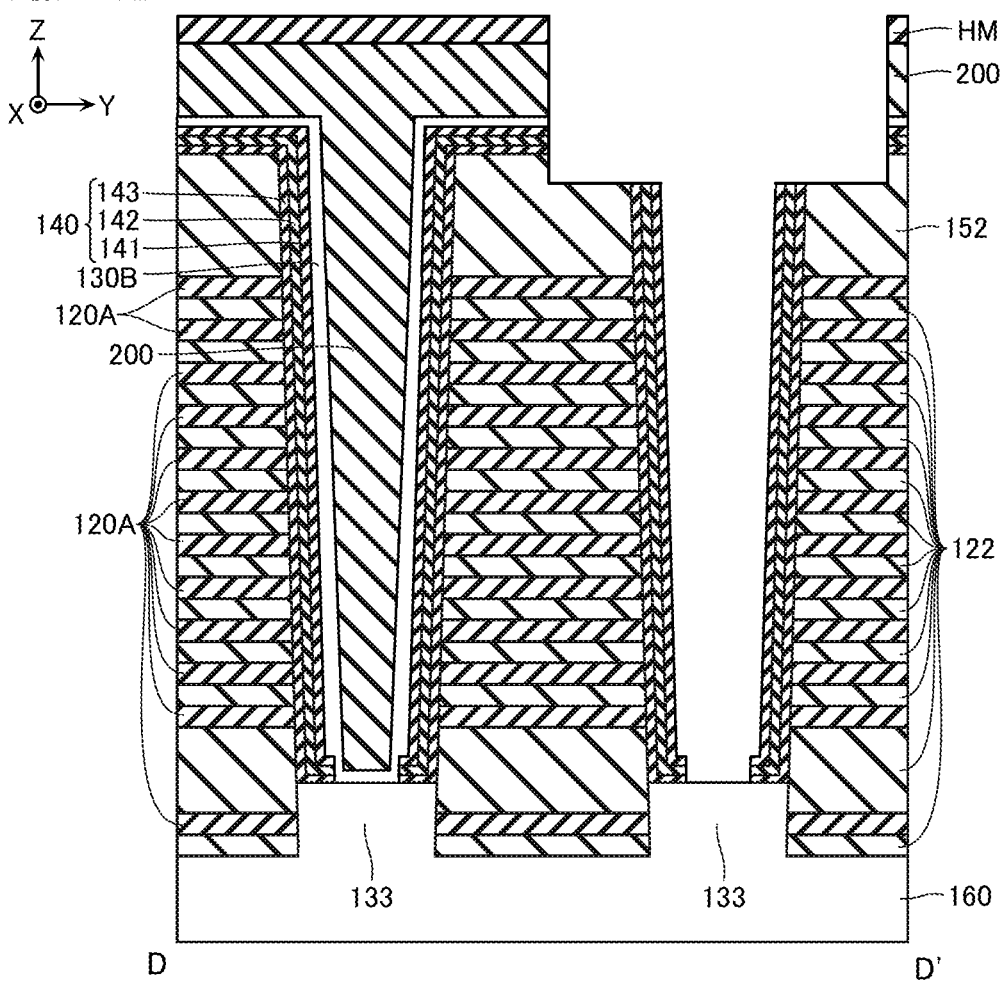

Subsequently, as illustrated in FIGS. 14A and 14B, the parts of the semiconductor layer 130B exposed to the openings AH are removed. This process is performed by isotropic etching by RIE or the like. Through this process, the parts of the semiconductor layer 130B disposed inside the openings MTa are separated in the X-direction.

Figure 15A:
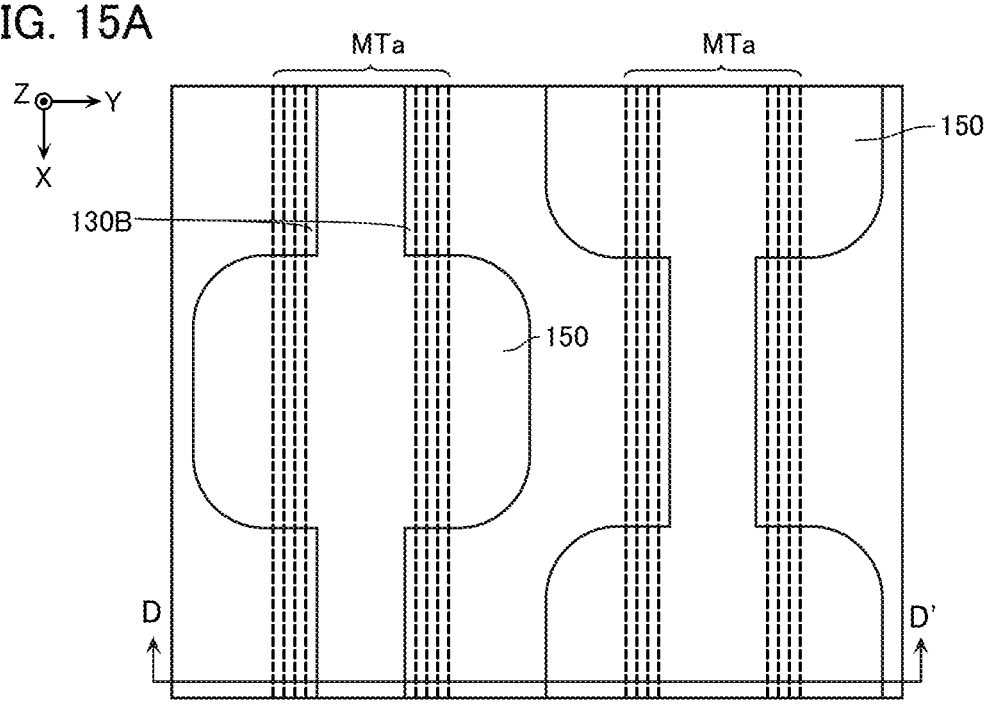
FIGS. 15A and 15B are schematic plan view and cross-sectional view illustrating the manufacturing method.
Figure 15B:
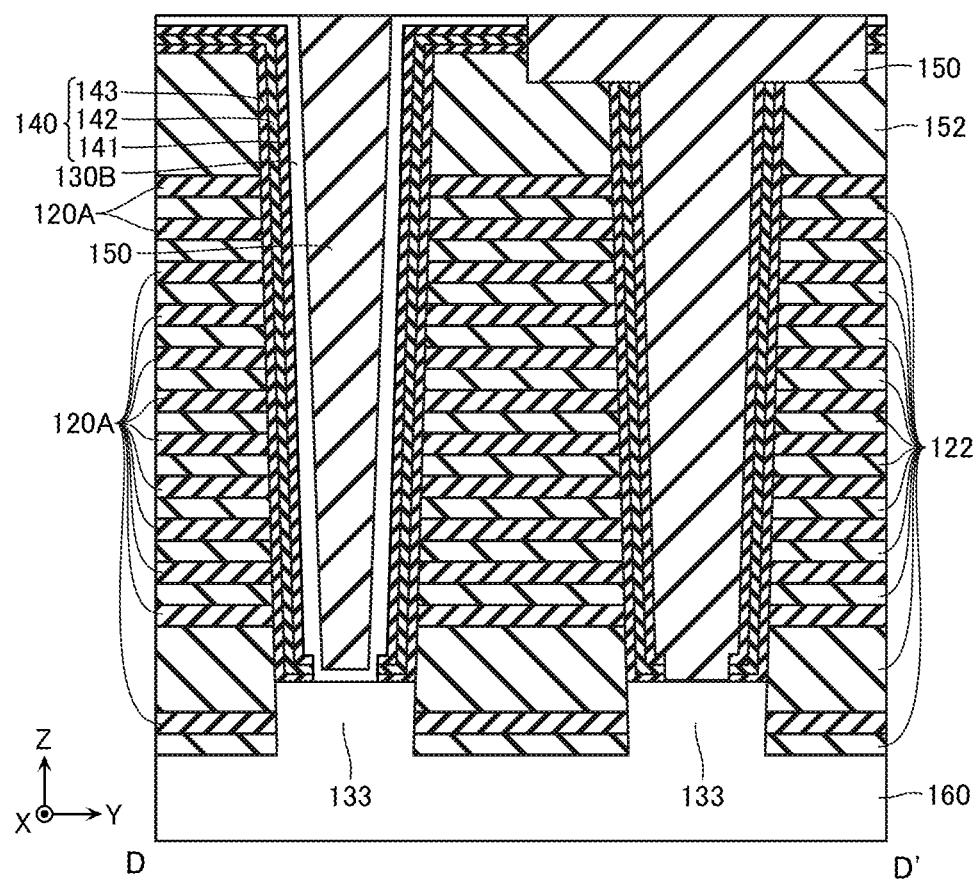

Subsequently, as illustrated in FIGS. 15A and 15B, the hard mask HM and the carbon film 200 are removed, and the insulating layer 150 is formed inside the openings MTa, thereby filling the opening portions. The removal of the hard mask HM is performed by wet etching or the like. The removal of the carbon film 200 is performed by asking or the like. The formation of the insulating layer 150 is performed by CVD or the like.

Figure 16A:
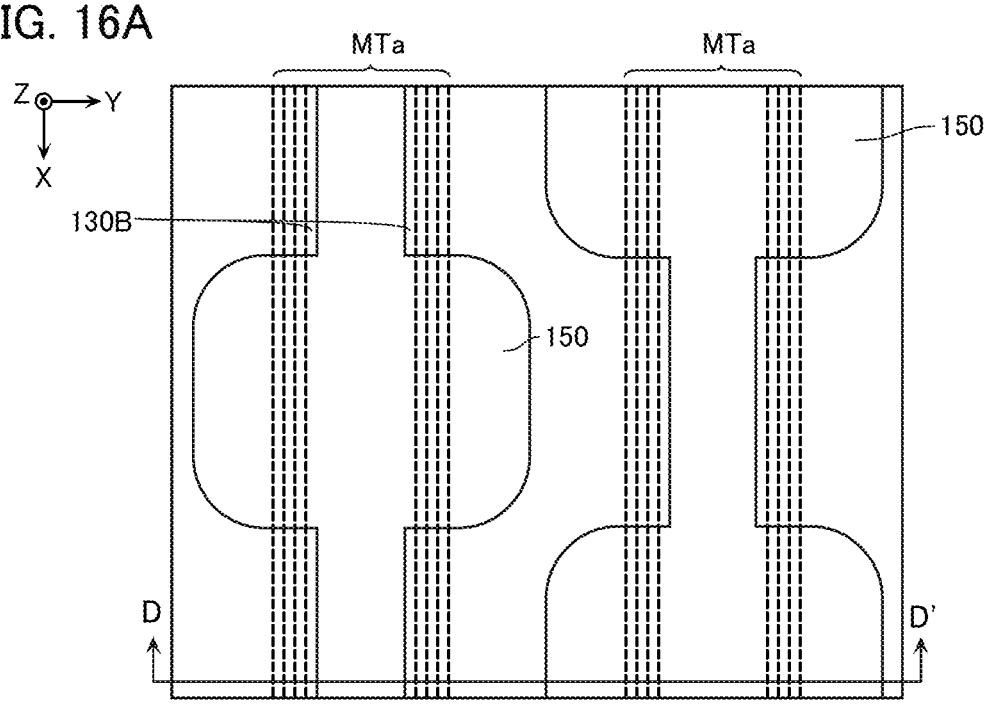
FIGS. 16A and 16B are schematic plan view and cross-sectional view illustrating the manufacturing method.
Figure 16B:
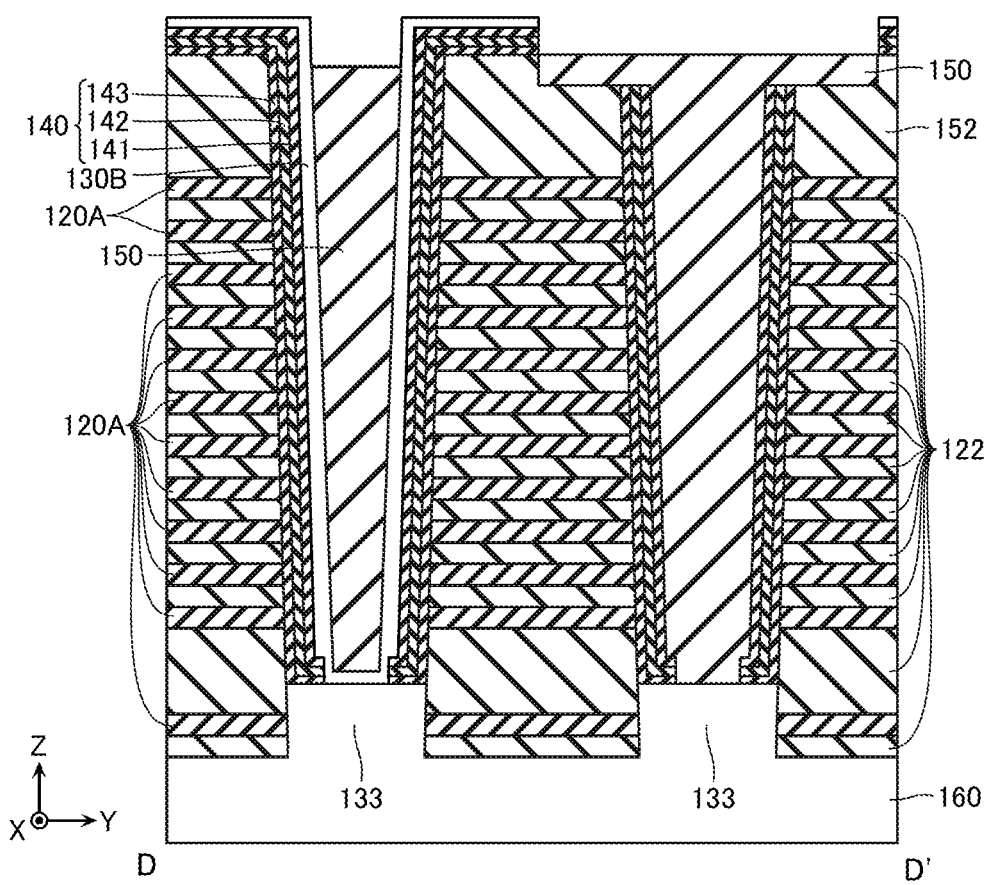

Subsequently, as illustrated in FIGS. 16A and 16B, the insulating layer 150 is partially and selectively removed. This process is performed such that, for example, the upper surface of the insulating layer 150 becomes lower than the upper surface of the insulating layer 152. This process is performed by RIE or the like.

Figure 17A:
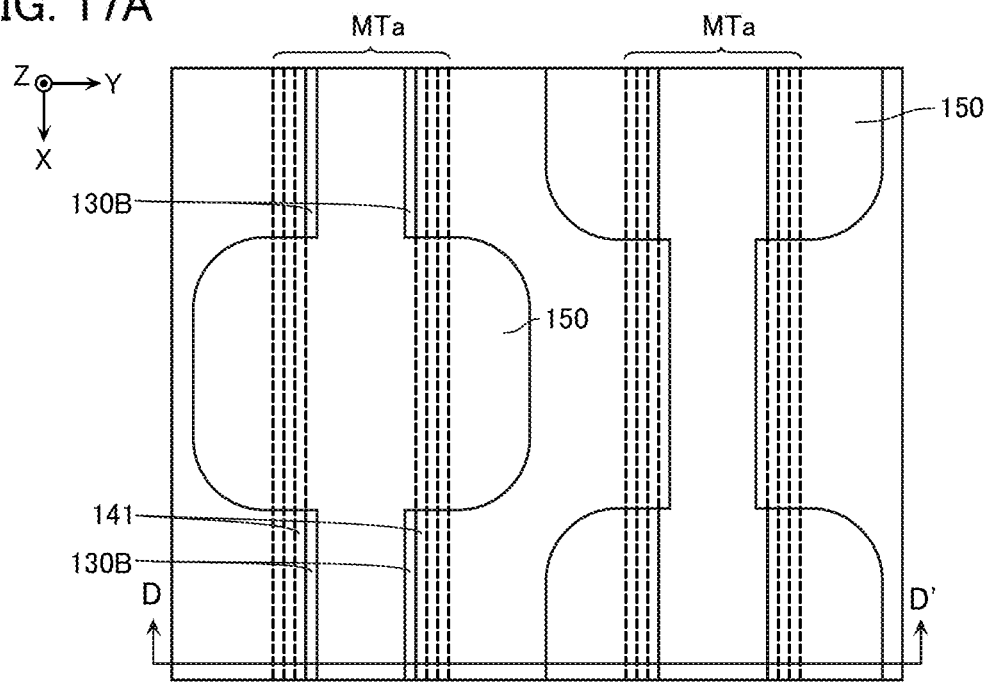
FIGS. 17A and 17B are schematic plan view and cross-sectional view illustrating the manufacturing method.
Figure 17B:
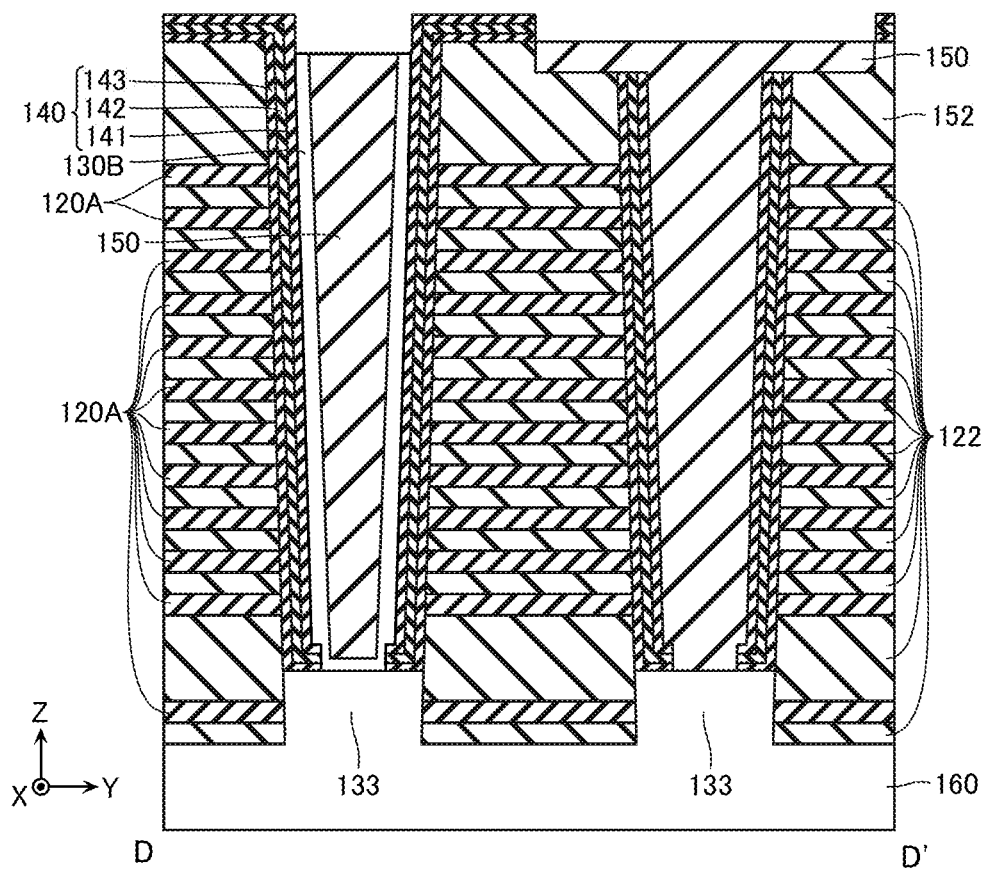

Subsequently, as illustrated in FIGS. 17A and 17B, the semiconductor layer 130B is partially and selectively removed to cause the upper surface of the tunnel insulating film 141 to be exposed. This process is performed by RIE or the like.

Figure 18A:
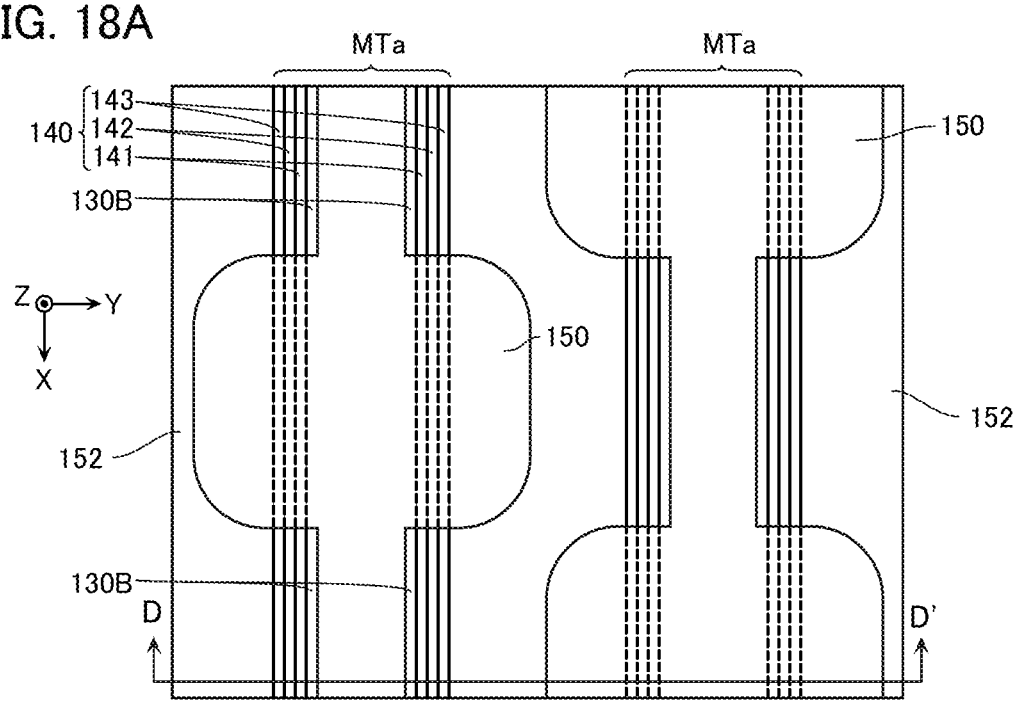
FIGS. 18A and 18B are schematic plan view and cross-sectional view illustrating the manufacturing method.
Figure 18B:
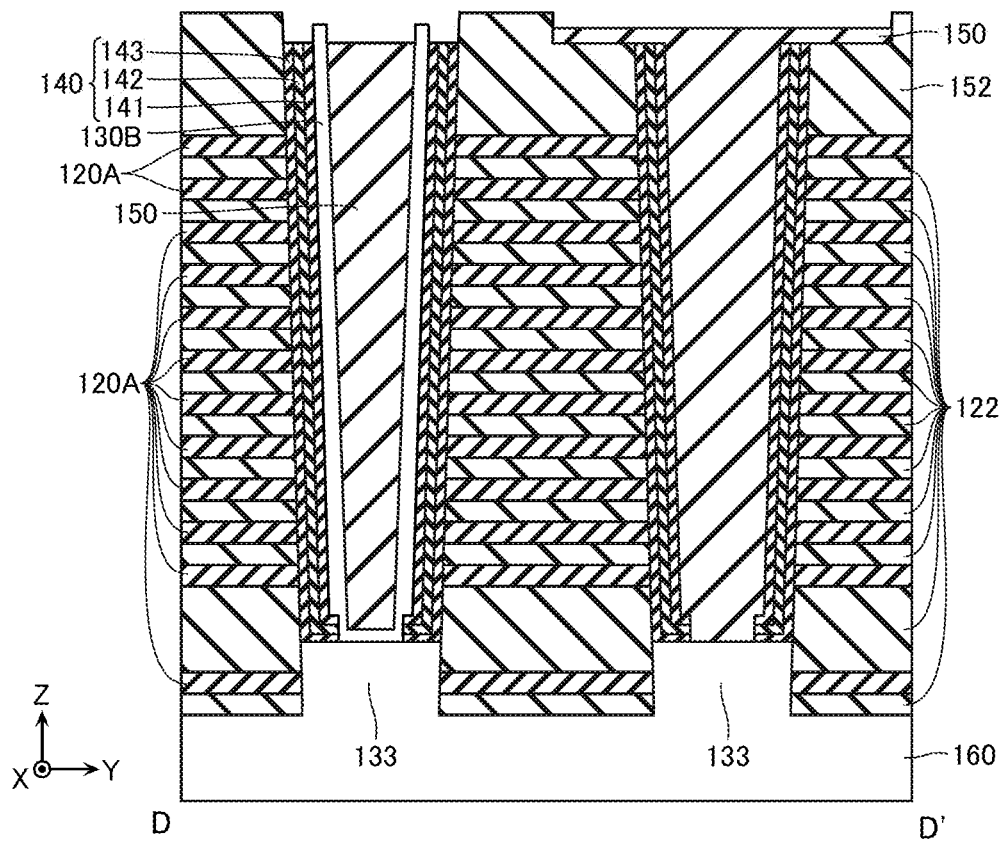

Subsequently, as illustrated in FIGS. 18A and 18B, the tunnel insulating film 141, the electric charge accumulating film 142, the block insulating film 143, and the insulating layer 150 are partially and selectively removed to cause the upper surface of the insulating layer 152 to be exposed. Through this process, both side surfaces in the Y-direction of the upper end portion of the semiconductor layer 130B are exposed. This process is performed by wet etching or the like.

Figure 19A:
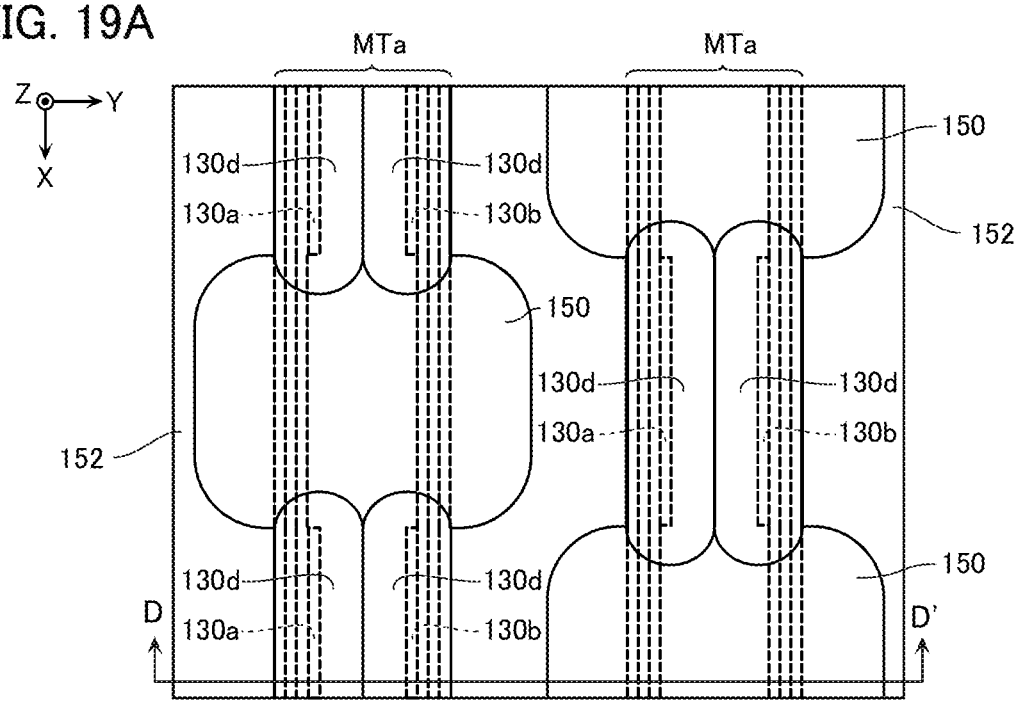
FIGS. 19A and 19B are schematic plan view and cross-sectional view illustrating the manufacturing method.
Figure 19B:
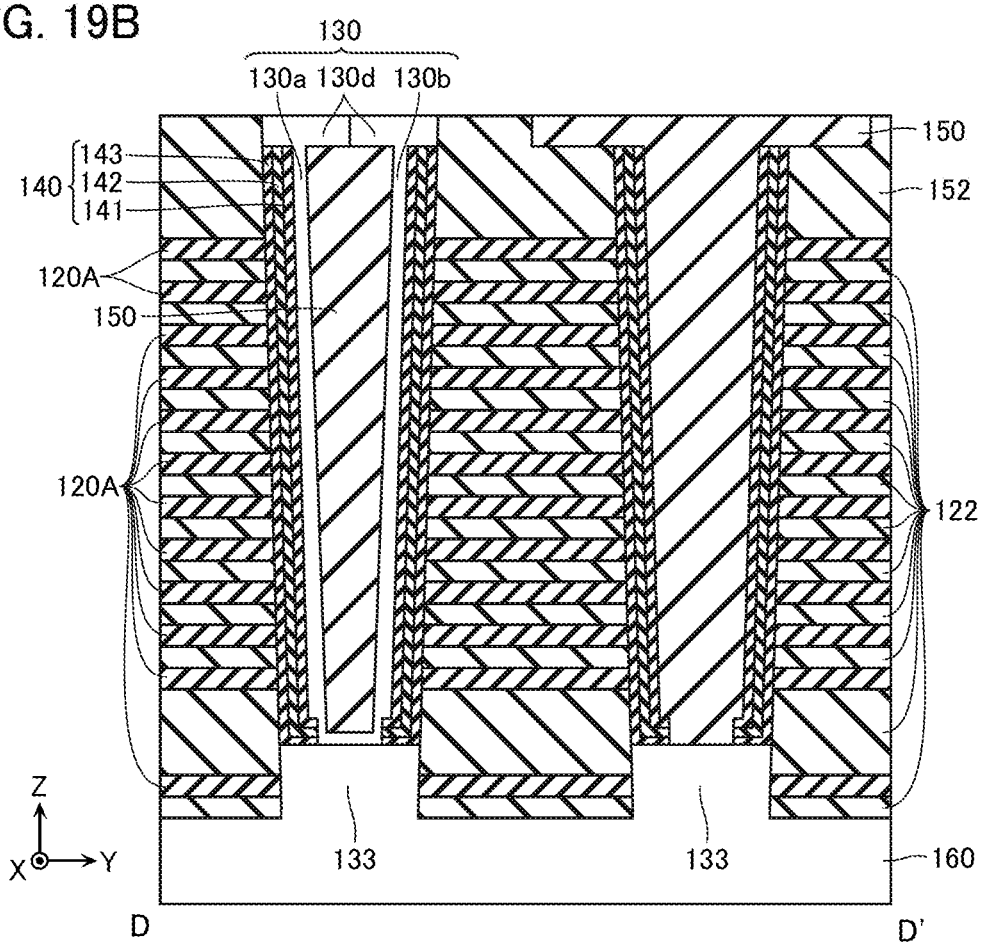

Subsequently, as illustrated in FIGS. 19A and 19B, the part 130d of the semiconductor layer 130 is formed. This process is performed by epitaxial growth or the like. Here, the side surfaces in the X-direction of the parts 130a and 130b of the semiconductor layer 130 have been processed by the method, such as RIE, in the process described with reference to FIGS. 14A and 14B. The upper surfaces of the parts 130a and 130b have been processed by the method, such as RIE, in the process described with reference to FIGS. 17A and 17B. Accordingly, in the side surfaces in the X-direction of the upper end portions and the upper surfaces of the parts 130a and 130b, the crystalline structure is disordered. In such an aspect, it is difficult for the side surfaces in the X-direction of the upper end portions and the upper surfaces of the parts 130a and 130b to function as reference surfaces of the epitaxial growth. Meanwhile, to the side surfaces in the Y-direction of the parts 130a and 130b, the process by the method, such as RIE, has not been performed. Accordingly, in the side surfaces in the Y-direction of the upper end portions of the parts 130a and 130b, the crystalline structure is not disordered. In such an aspect, it is easy for the side surfaces in the Y-direction of the upper end portions of the parts 130a and 130b to function as the reference surfaces of the epitaxial growth. Therefore, the epitaxial growth in such a state increases the speed of the crystal growth in the Y-direction compared with the speed of the crystal growth in the X-direction and the Z-direction. Accordingly, the crystal of silicon (Si) grows mainly in the Y-direction, and the structure extending in the Y-direction as illustrated in FIGS. 19A and 19B is formed.

Note that when the part 130d of the semiconductor layer 130 is formed by such a method, an interface layer is not formed between the part 130d and the part 130a. Similarly, an interface layer is not formed between the part 130d and the part 130b.

Figure 20:
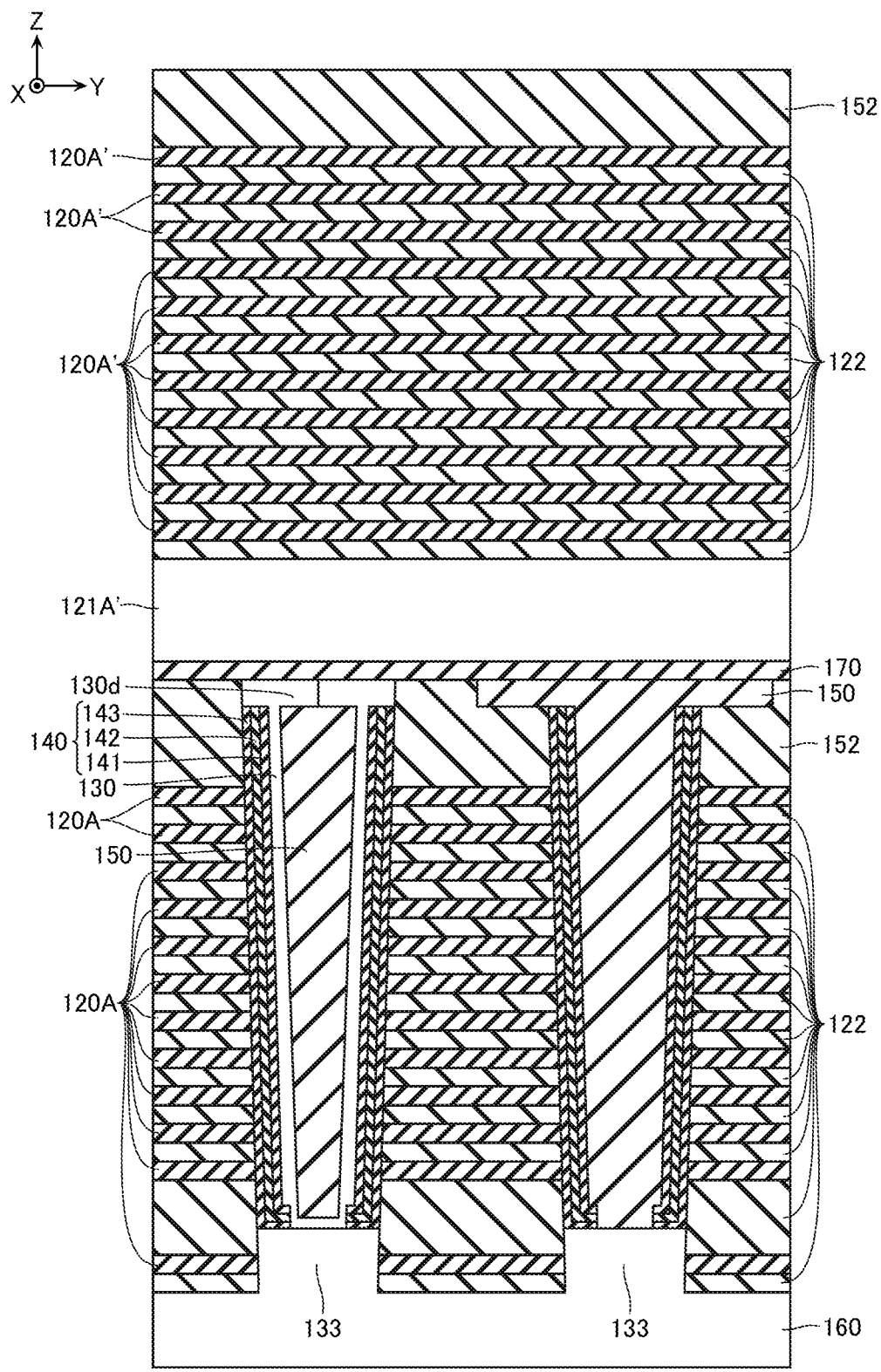
FIG. 20 is a schematic cross-sectional view illustrating the manufacturing method.

Subsequently, as illustrated in FIG. 20, a flattening process is performed to the upper surface of the structure illustrated in FIGS. 19A and 19B. This process is performed with an etchback by RIE or the like. On the flattened surface, the insulating layer 170 and a semiconductor layer 121A' are formed. On an upper surface of the semiconductor layer 121A', a plurality of insulating layers 122 and sacrificial layers 120A' are laminated in alternation. On an upper surface of the uppermost layer of the sacrificial layers 120A', the insulating layer 152 is formed. The sacrificial layer 120A' contains silicon nitride (SiN) or the like. The insulating layer 152 contains silicon oxide ($SiO_2$) or the like. The film formations of the insulating layer 170, the semiconductor layer 121A', the insulating layer 122, the sacrificial layer 120A', and the insulating layer 152 are performed by CVD or the like.

Figure 21:
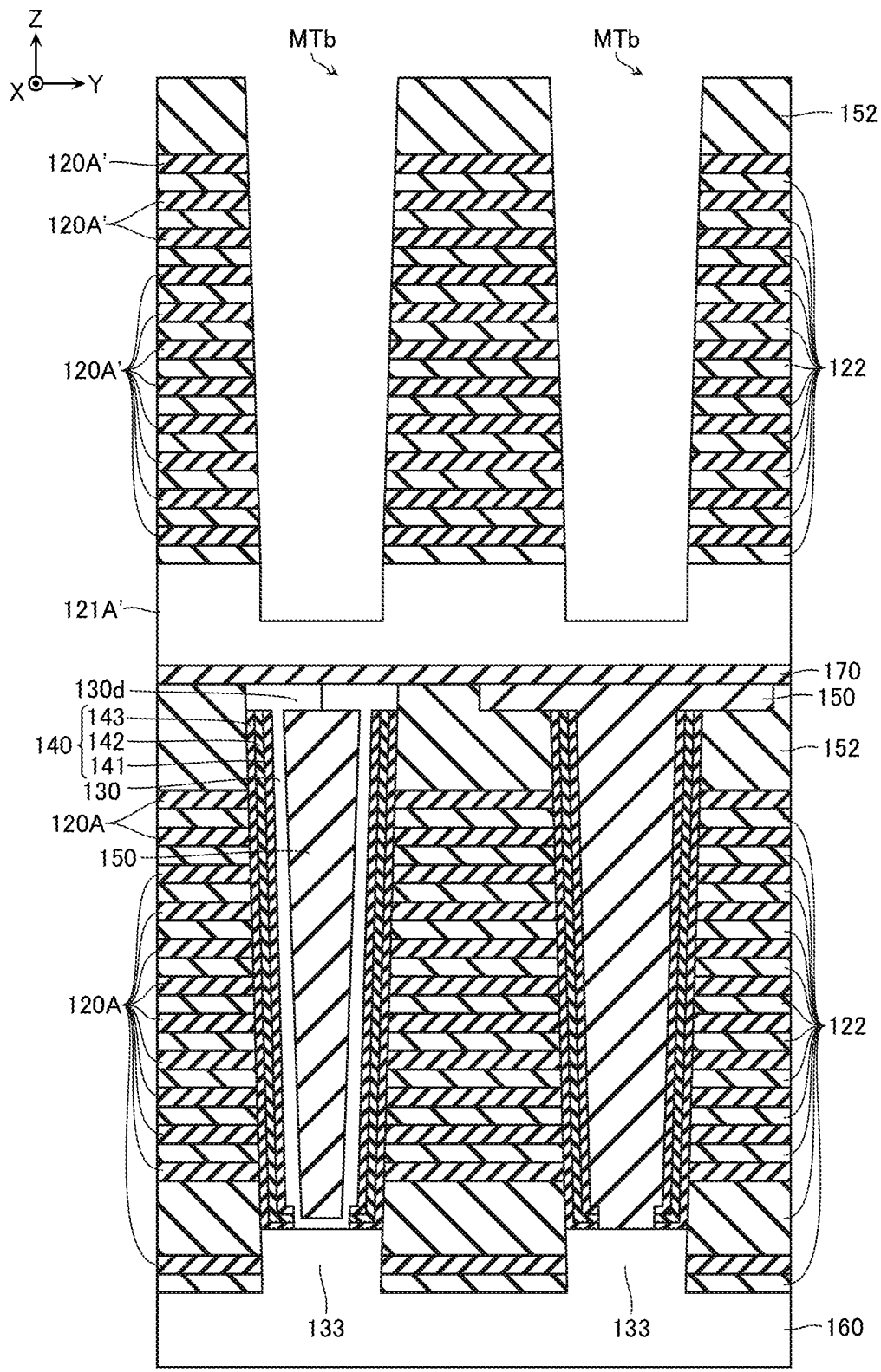
FIG. 21 is a schematic cross-sectional view illustrating the manufacturing method.

Subsequently, as illustrated in FIG. 21, openings MTb are formed to the insulating layer 152, insulating layers 122', and the sacrificial layers 120A'. This process is performed similarly to the process illustrated in FIGS. 7A and 7B.

The opening MTb extends in the Z-direction, separates the insulating layers 122, the sacrificial layers 120A', and the insulating layer 152 in the Y-direction, and causes the upper surface of the semiconductor layer 121A' to be exposed.

Figure 22:
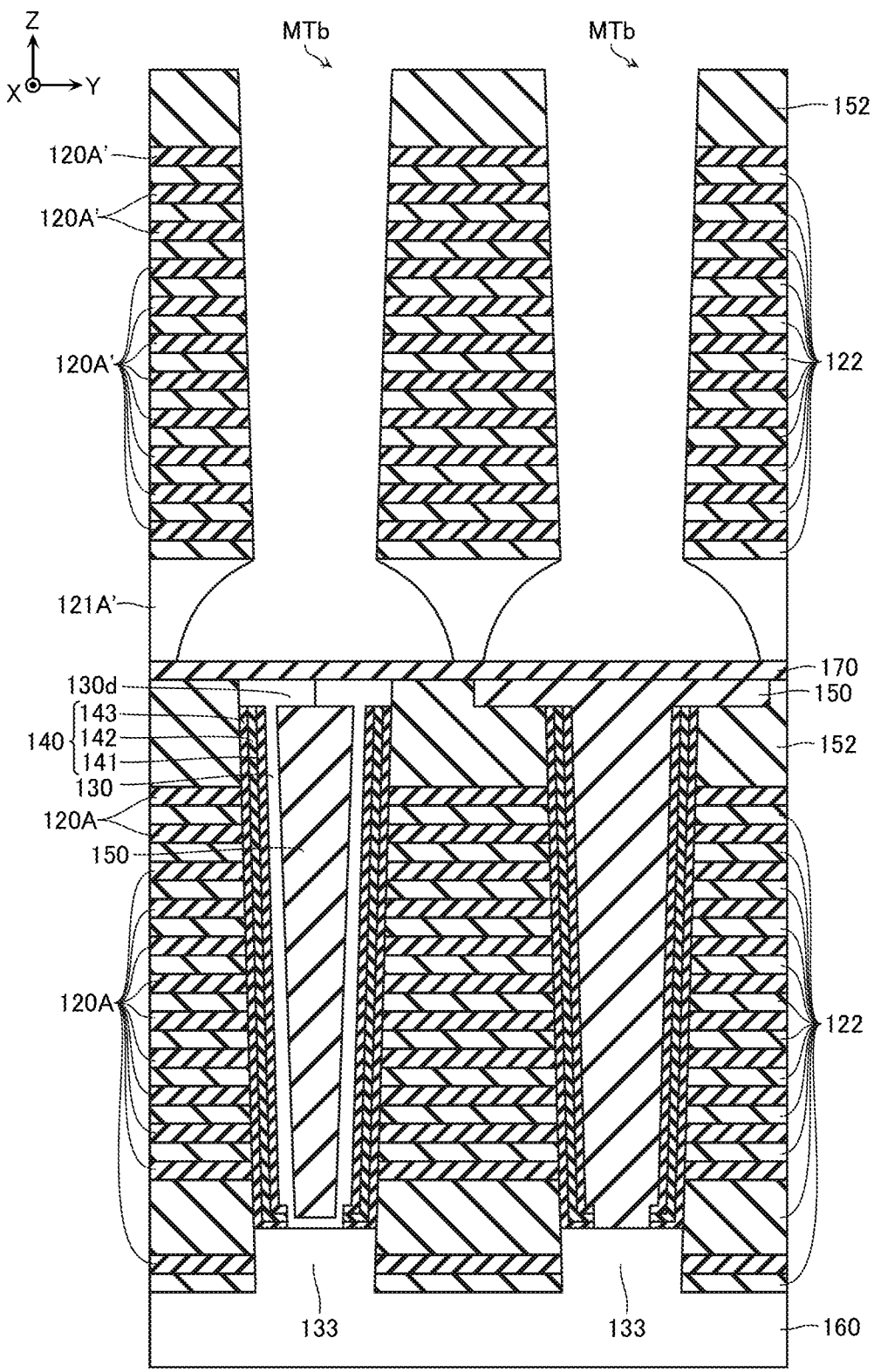
FIG. 22 is a schematic cross-sectional view illustrating the manufacturing method.

Subsequently, as illustrated in FIG. 22, the semiconductor layer 121A' is partially and selectively removed via the openings MTb to cause the upper surface of the insulating layer 170 to be exposed. This process increases a width in the Y-direction of a lower portion of the opening MTb. This process is performed by a method, such as an isotropic dry etching.

Figure 23:
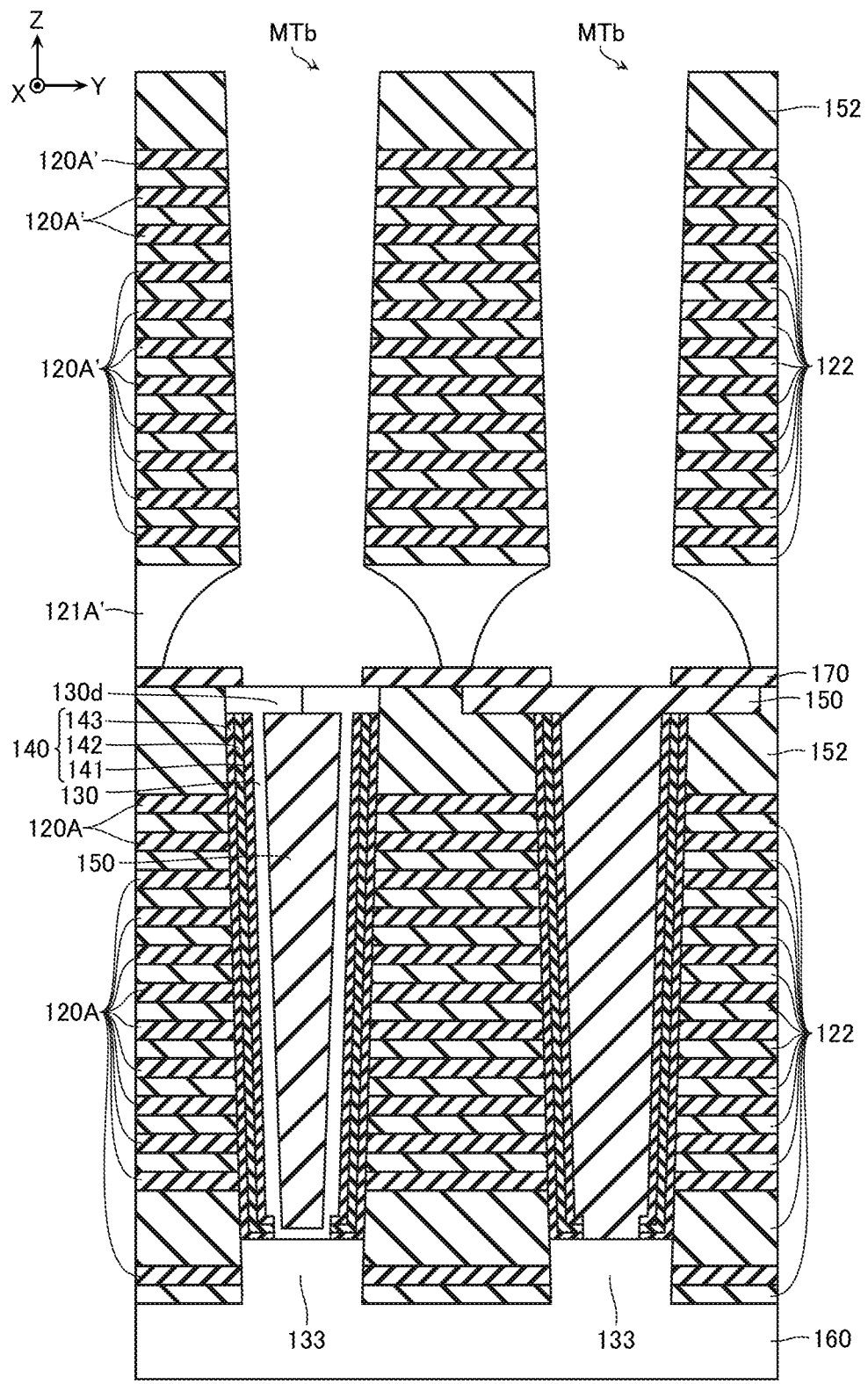
FIG. 23 is a schematic cross-sectional view illustrating the manufacturing method.

Subsequently, as illustrated in FIG. 23, in the insulating layer 170, the parts disposed on the bottom surface portions of the openings MTb are removed, and causes the parts 130*d* of the semiconductor layer 130 to be exposed. This process is performed by a method, such as RIE.

Figure 24:
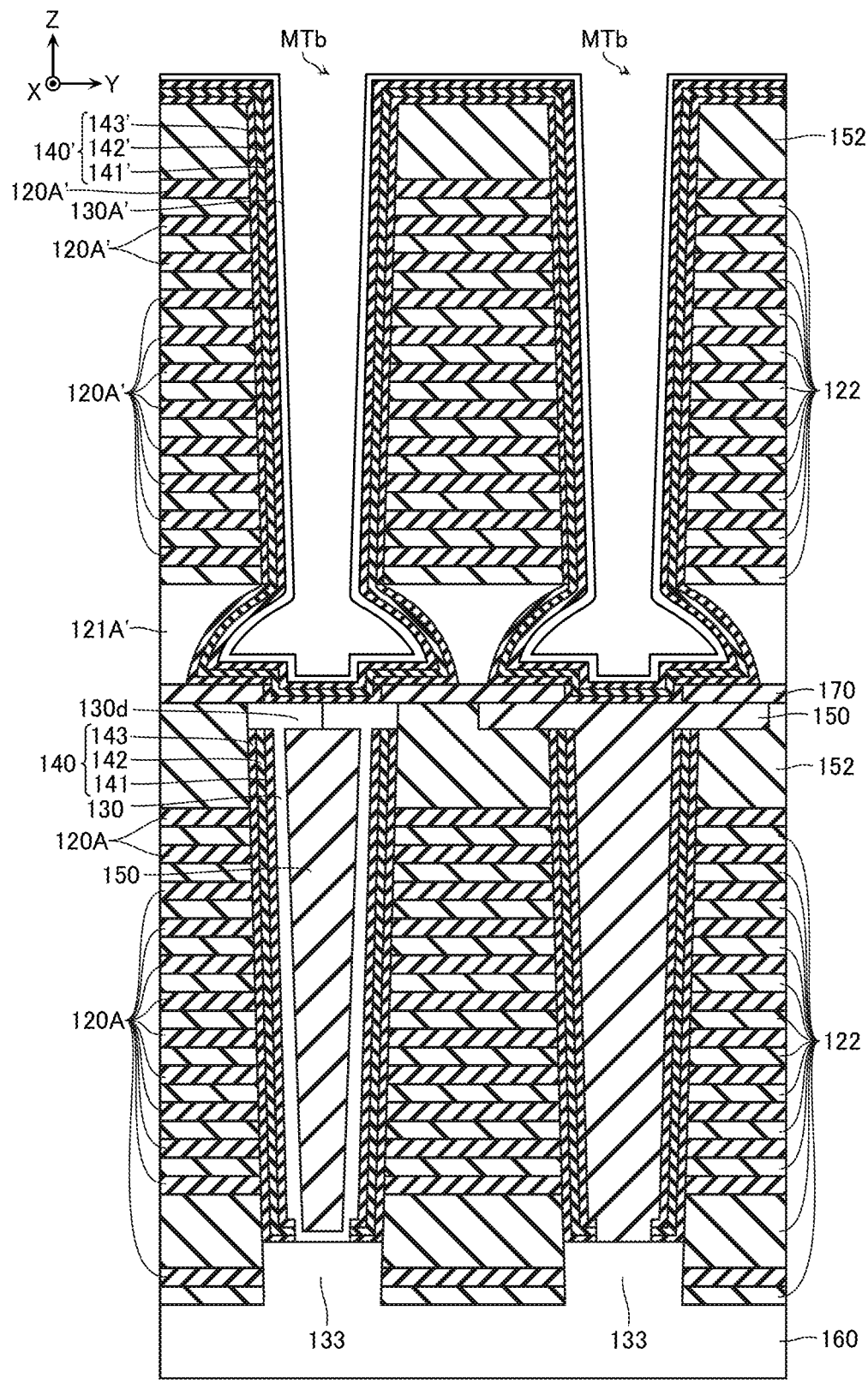
FIG. 24 is a schematic cross-sectional view illustrating the manufacturing method.

Subsequently, as illustrated in FIG. 24, the block insulating film 143', the electric charge accumulating film 142', the tunnel insulating film 141', and an amorphous silicon film 130A' are formed on the upper surface of the insulating layer 152 and bottom surfaces and side surfaces of the openings MTb. This process is performed by a method, such as CVD.

Figure 25:
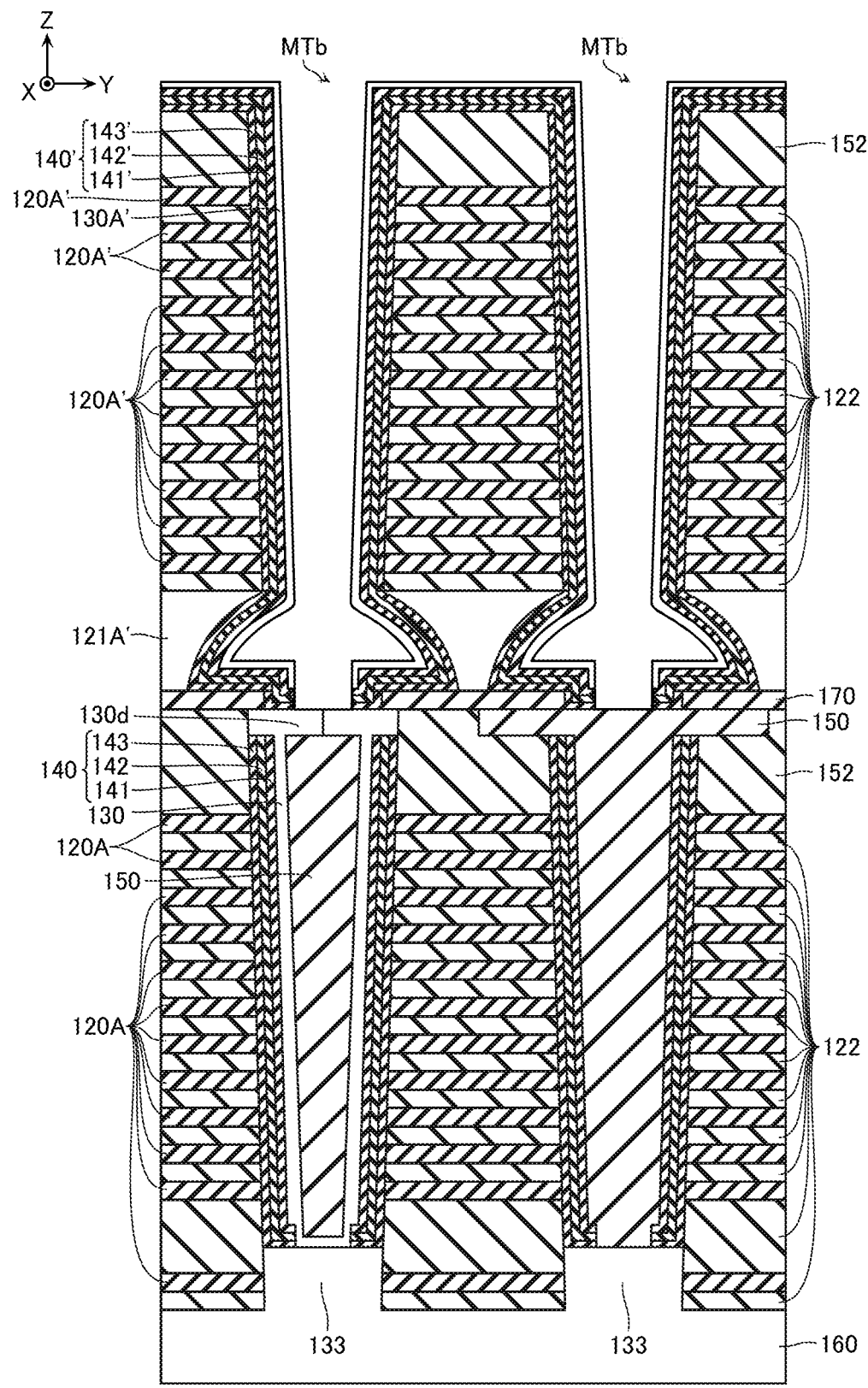
FIG. 25 is a schematic cross-sectional view illustrating the manufacturing method.

Subsequently, as illustrated in FIG. 25, in the block insulating film 143', the electric charge accumulating film 142', the tunnel insulating film 141', and the amorphous silicon film 130A', the parts disposed on the bottom surface portions of the openings MTb are removed, and causes the parts 130*d* of the semiconductor layer 130 to be exposed. This process is performed by RIE or the like.

Figure 26:
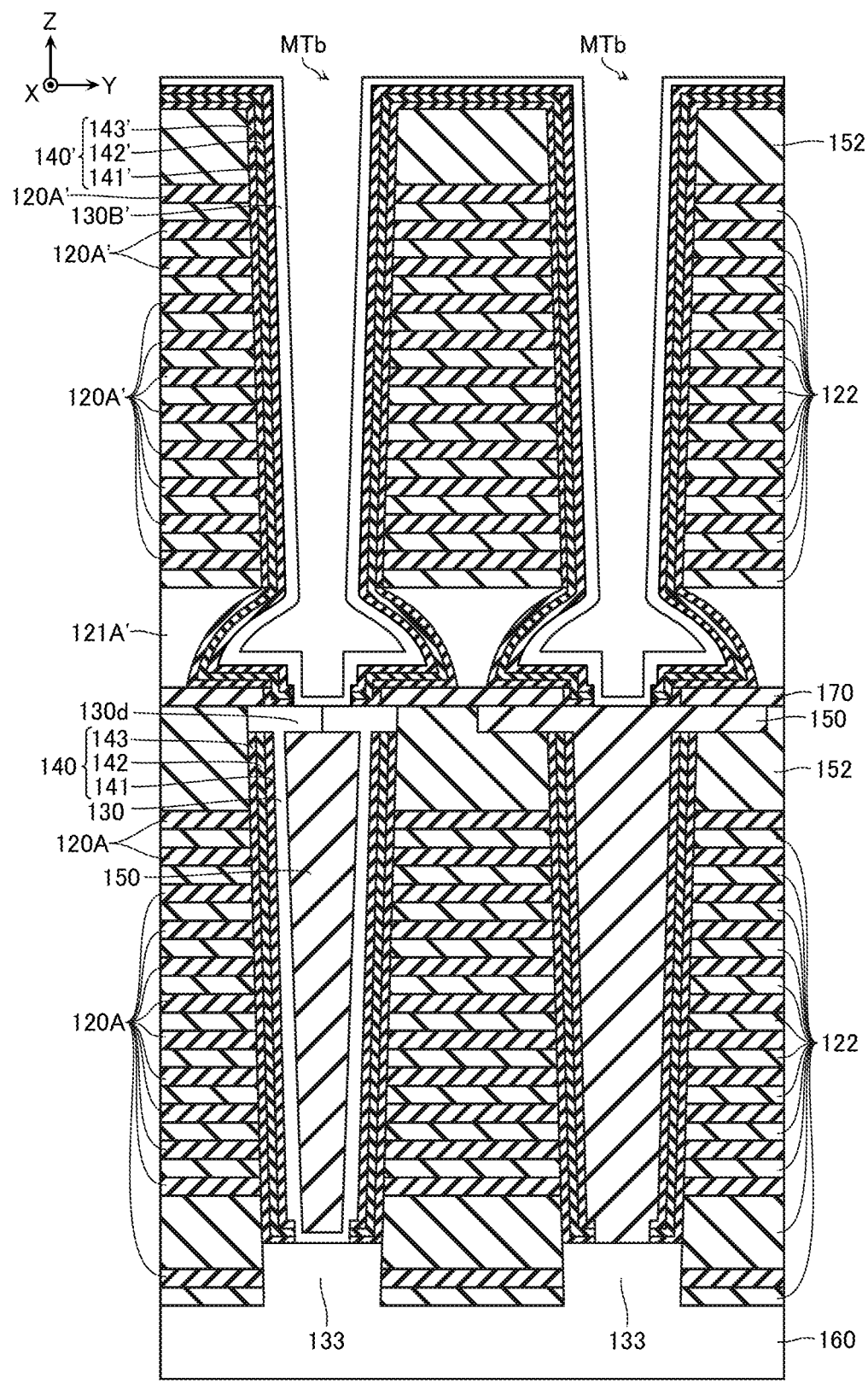
FIG. 26 is a schematic cross-sectional view illustrating the manufacturing method.

Subsequently, as illustrated in FIG. 26, an amorphous silicon film is formed on the upper surfaces of the parts 130*d* of the semiconductor layer 130 and side surfaces and upper surfaces of the amorphous silicon film 130A'. This process is performed by a method, such as CVD. Subsequently, a heat treatment or the like is performed to modify a crystalline structure of the amorphous silicon film 130A', thus forming a semiconductor layer 130B' of polycrystalline silicon (Si) or the like.

Figure 27:
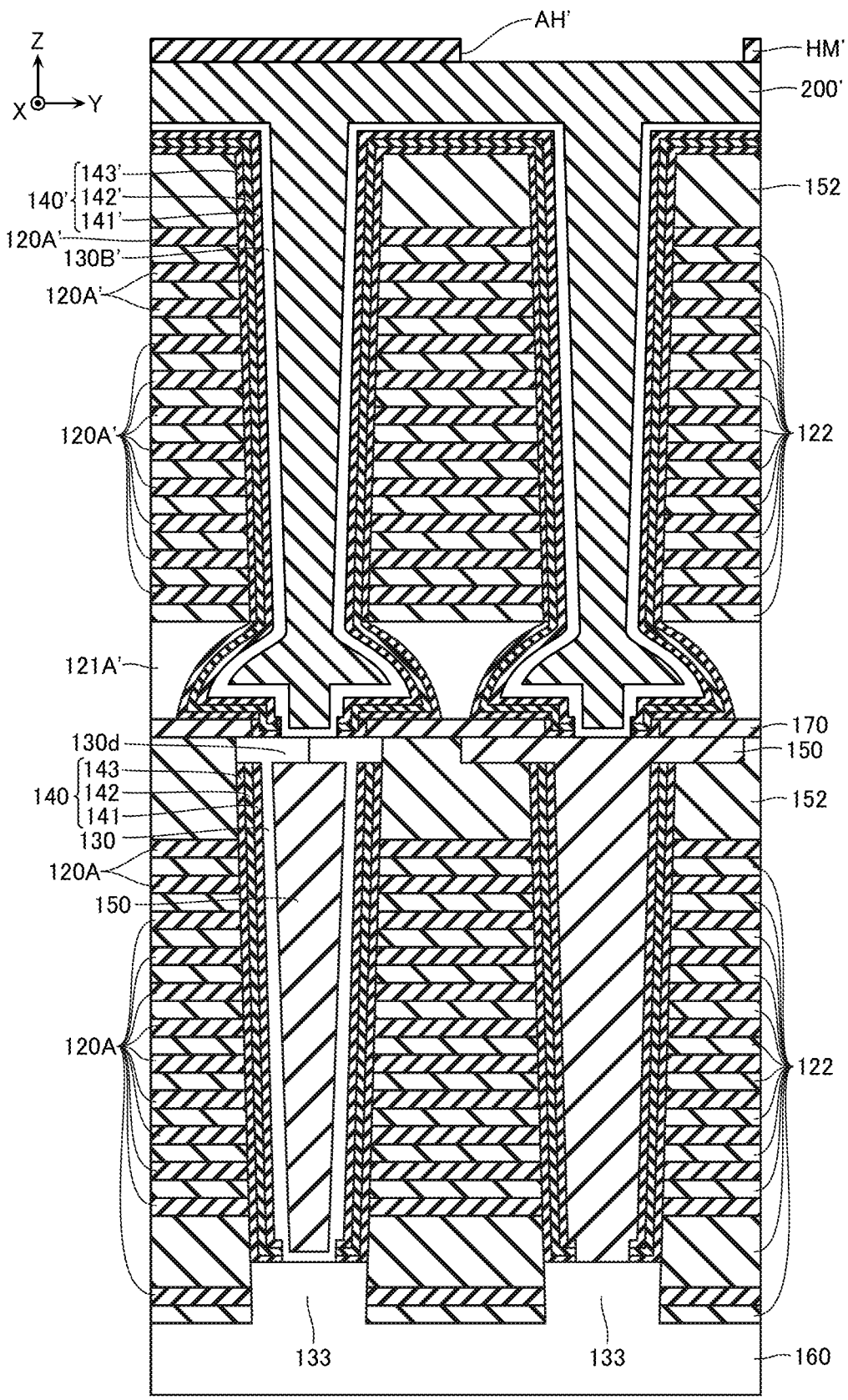
FIG. 27 is a schematic cross-sectional view illustrating the manufacturing method.

Subsequently, as illustrated in FIG. 27, a carbon film 200' is formed inside the openings MTb, and subsequently, a hard mask HM' of an oxide film or the like is formed on an upper surface of the carbon film 200'. The formation of the carbon film 200' is performed by, for example, spin coating of a coating type carbon film material. The formation of the hard mask HM' is performed by CVD or the like.

Subsequently, as illustrated in FIG. 27, openings AH' are provided to the hard mask HM'. The openings AH' are provided at positions corresponding to the inter-memory unit structures IMUS2 (FIG. 2). The formation of the openings AH' is performed by a method, such as photolithography and wet etching.

Figure 28:
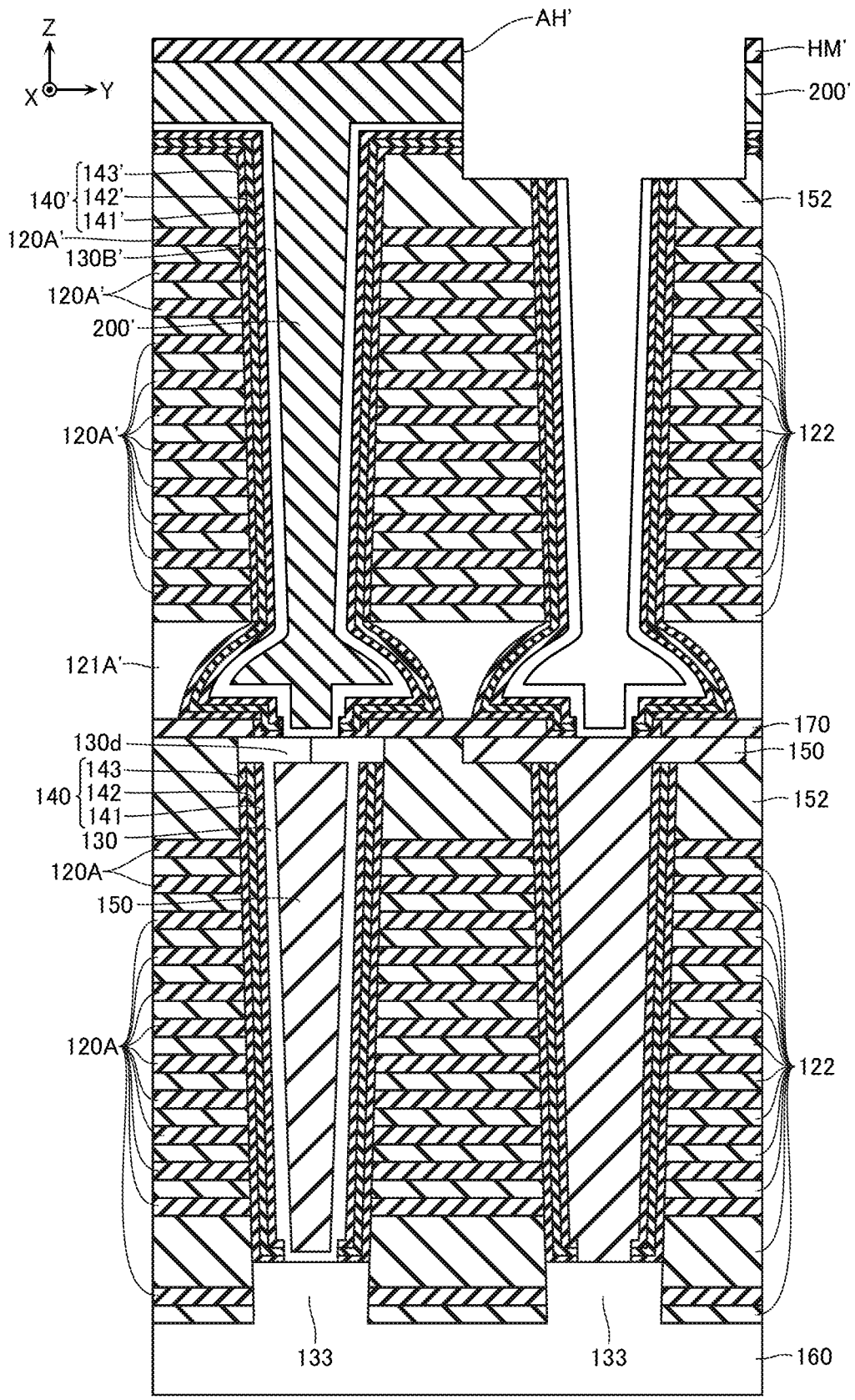
FIG. 28 is a schematic cross-sectional view illustrating the manufacturing method.

Subsequently, as illustrated in FIG. 28, the parts of the carbon film 200' disposed at the positions corresponding to the openings AH' are removed. This process is performed by RIE or the like. Note that in this process, a part of the semiconductor layer 130B', a part of the tunnel insulating film 141', a part of the electric charge accumulating film 142', and a part of the block insulating film 143' are also removed, and a part of the insulating layer 152 is exposed.

Figure 29:
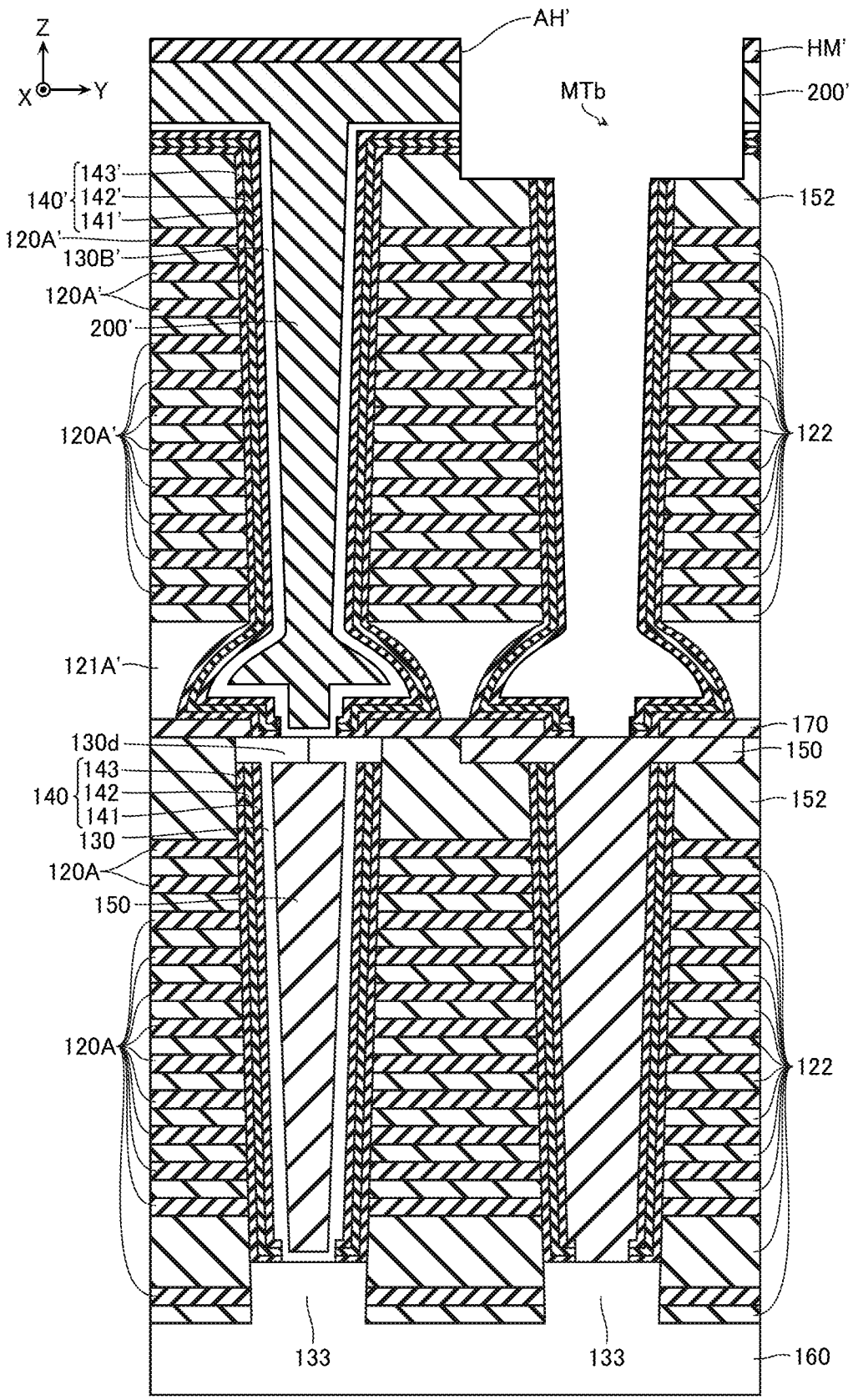
FIG. 29 is a schematic cross-sectional view illustrating the manufacturing method.

Subsequently, as illustrated in FIG. 29, the parts of the semiconductor layer 130B' exposed to the openings AH' are removed. This process is performed by isotropic etching by RIE or the like. Through this process, the parts of the semiconductor layer 130B' disposed inside the openings MTb are separated in the X-direction.

Figure 30:
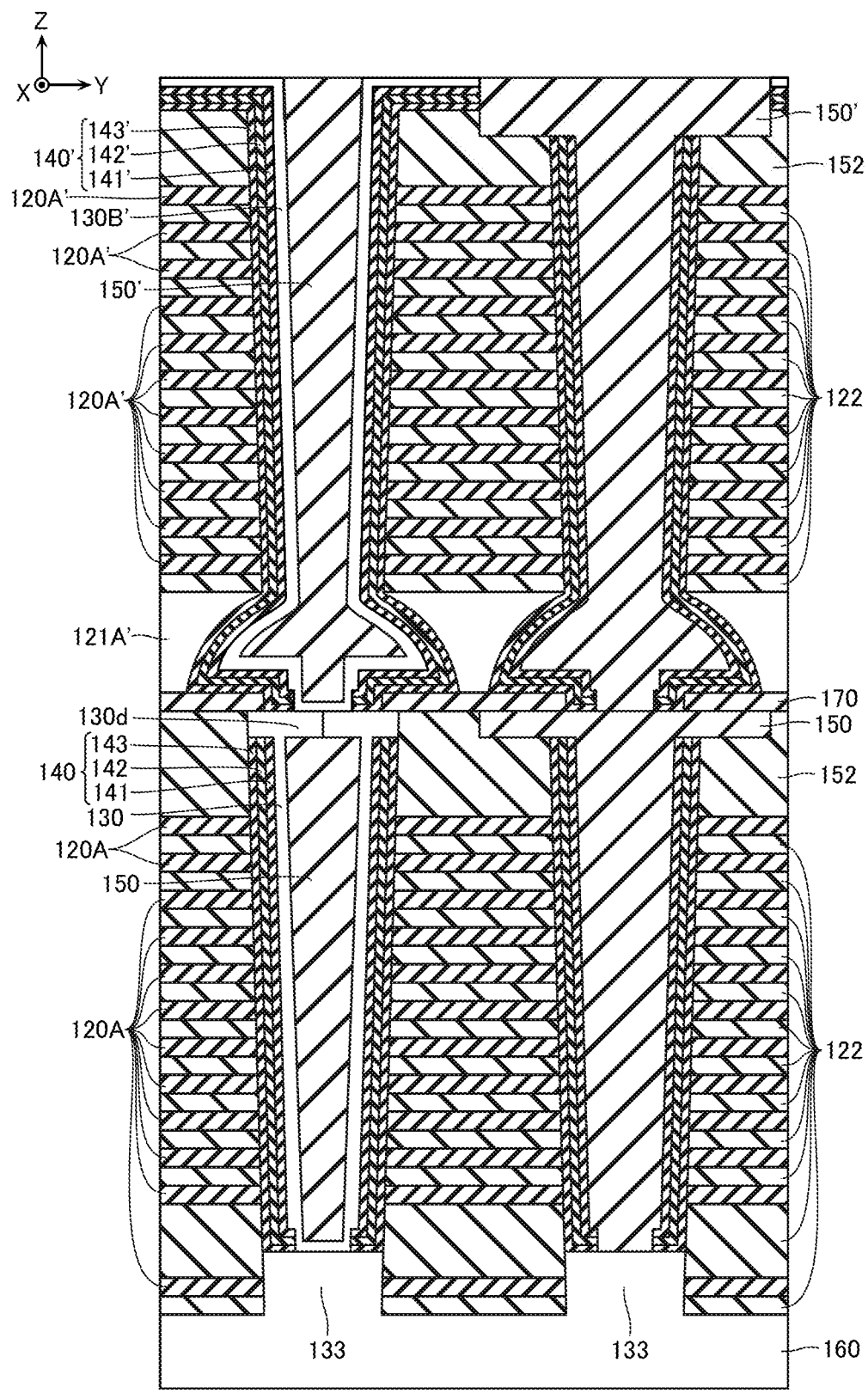
FIG. 30 is a schematic cross-sectional view illustrating the manufacturing method.

Subsequently, as illustrated in FIG. 30, the hard mask HM' and the carbon film 200' are removed, and the insulating layer 150' is formed inside the openings MTb, thereby filling the opening portions. The removal of the hard mask HM' is performed by wet etching or the like. The removal of the carbon film 200' is performed by asking or the like. The formation of the insulating layer 150' is performed by CVD or the like.

Figure 31:
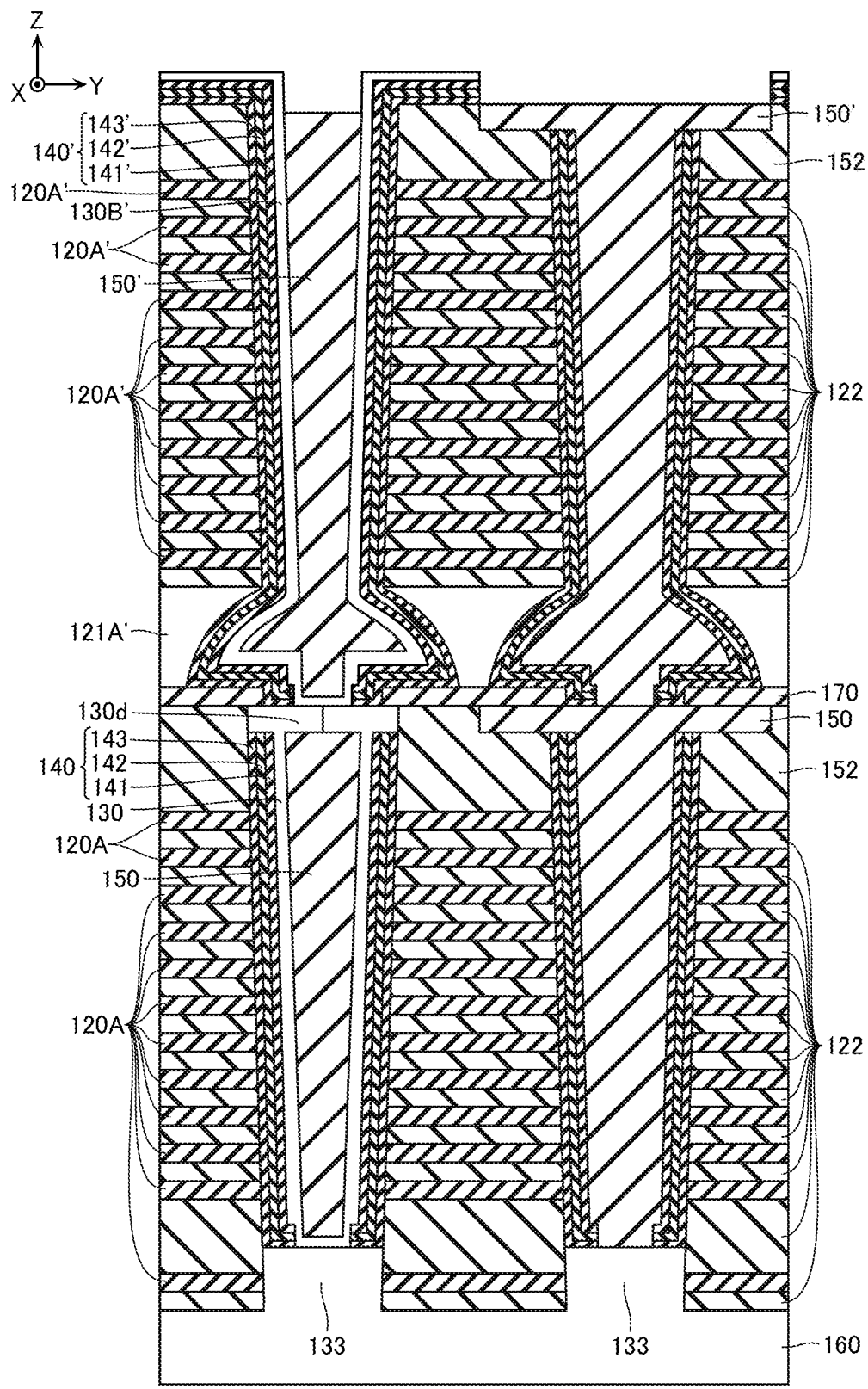
FIG. 31 is a schematic cross-sectional view illustrating the manufacturing method.

Subsequently, as illustrated in FIG. 31, the insulating layer 150' is partially and selectively removed. This process is performed such that, for example, the upper surface of the insulating layer 150' becomes lower than the upper surface of the insulating layer 152. This process is performed by RIE or the like.

Figure 32:
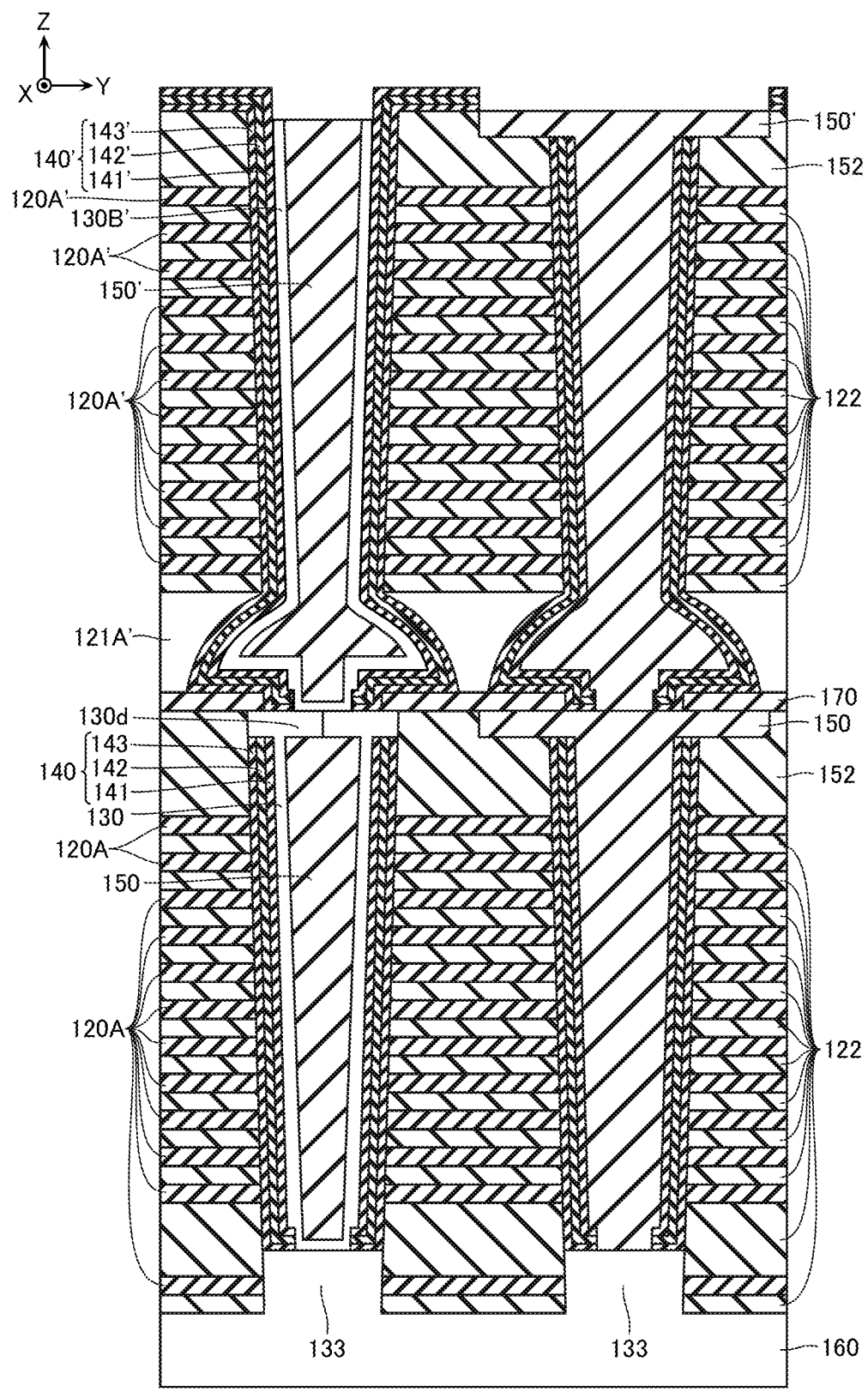
FIG. 32 is a schematic cross-sectional view illustrating the manufacturing method.

Subsequently, as illustrated in FIG. 32, the semiconductor layer 130B' is partially and selectively removed to cause the upper surface of the tunnel insulating film 141' to be exposed. This process is performed by RIE or the like.

Figure 33:
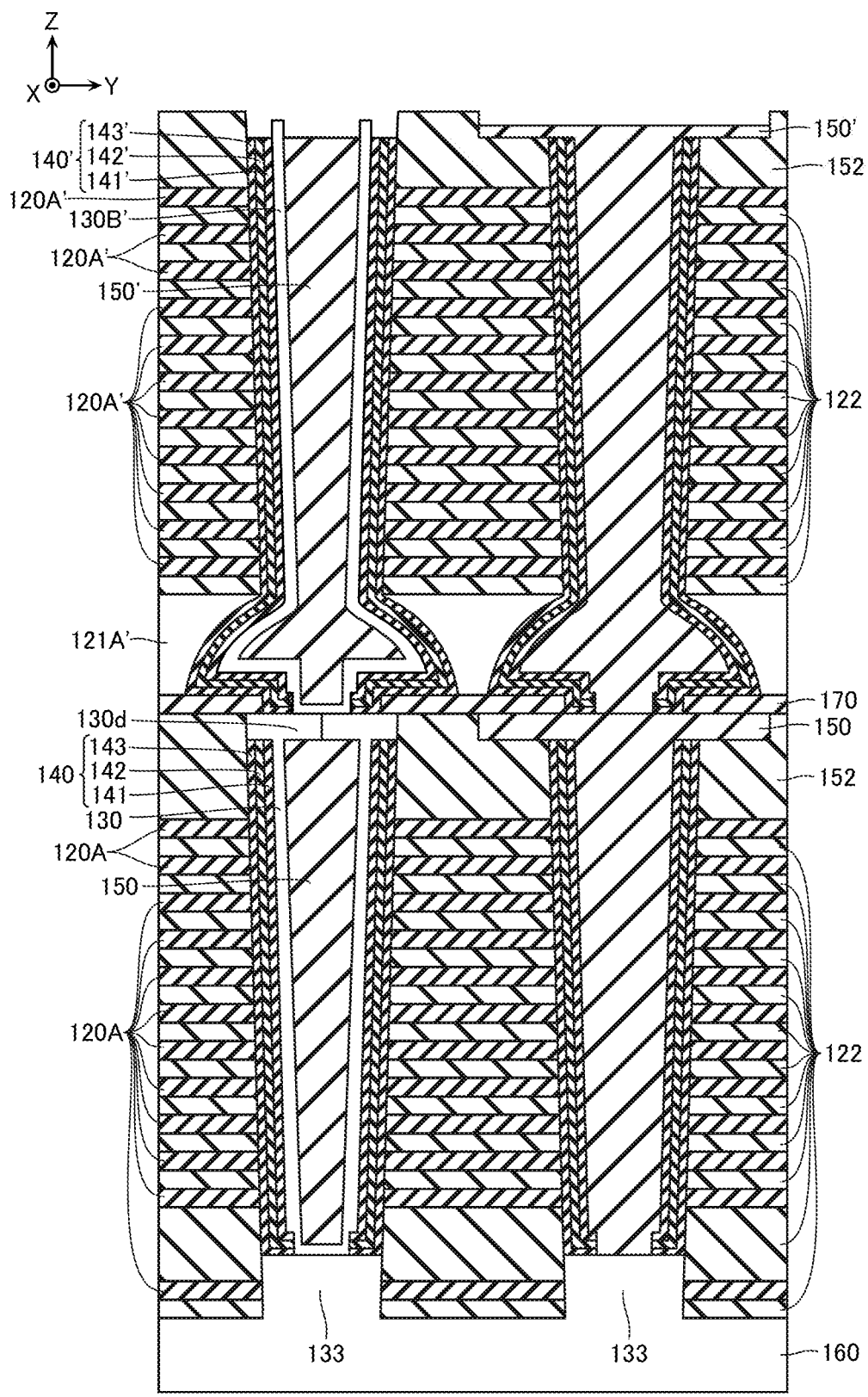
FIG. 33 is a schematic cross-sectional view illustrating the manufacturing method.

Subsequently, as illustrated in FIG. 33, the tunnel insulating film 141', the electric charge accumulating film 142', the block insulating film 143', and the insulating layer 150' are partially and selectively removed to cause the upper surface of the insulating layer 152 to be exposed. Through this process, both side surfaces in the Y-direction of the upper end portion of the semiconductor layer 130B' are exposed. This process is performed by wet etching or the like.

Figure 34:
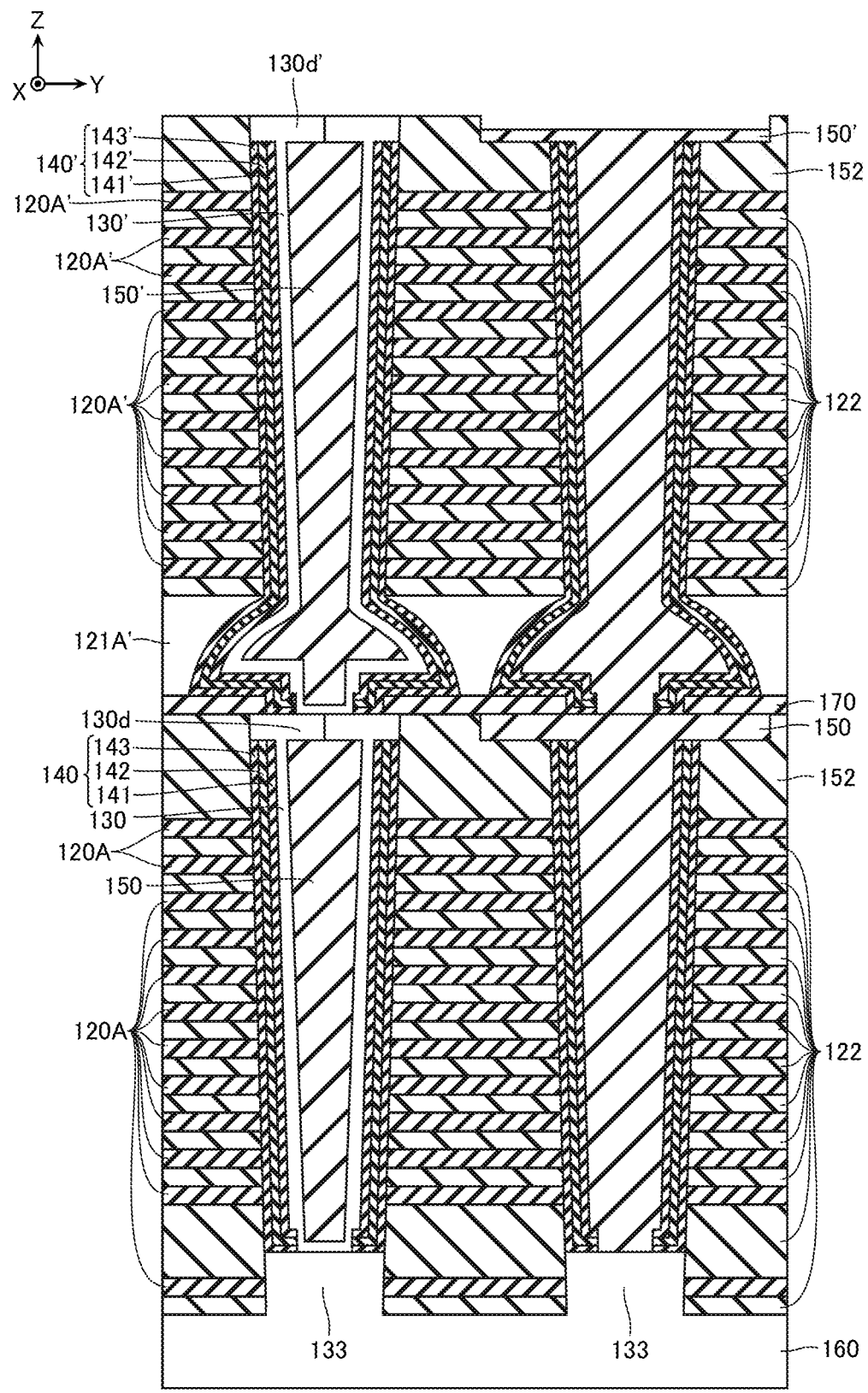
FIG. 34 is a schematic cross-sectional view illustrating the manufacturing method.

Subsequently, as illustrated in FIG. 34, the part 130*d'* of the semiconductor layer 130' is formed. This process is performed by epitaxial growth or the like.

Note that when the part 130*d'* of the semiconductor layer 130' is formed by such a method, an interface layer is not formed between the part 130*d'* and the part 130*a'*. Similarly, an interface layer is not formed between the part 130*d'* and the part 130*b'*.

Subsequently, the plurality of sacrificial layers 120A and sacrificial layers 120A' are removed via openings (not illustrated). This process is performed by wet etching or the like.

Figure 35:
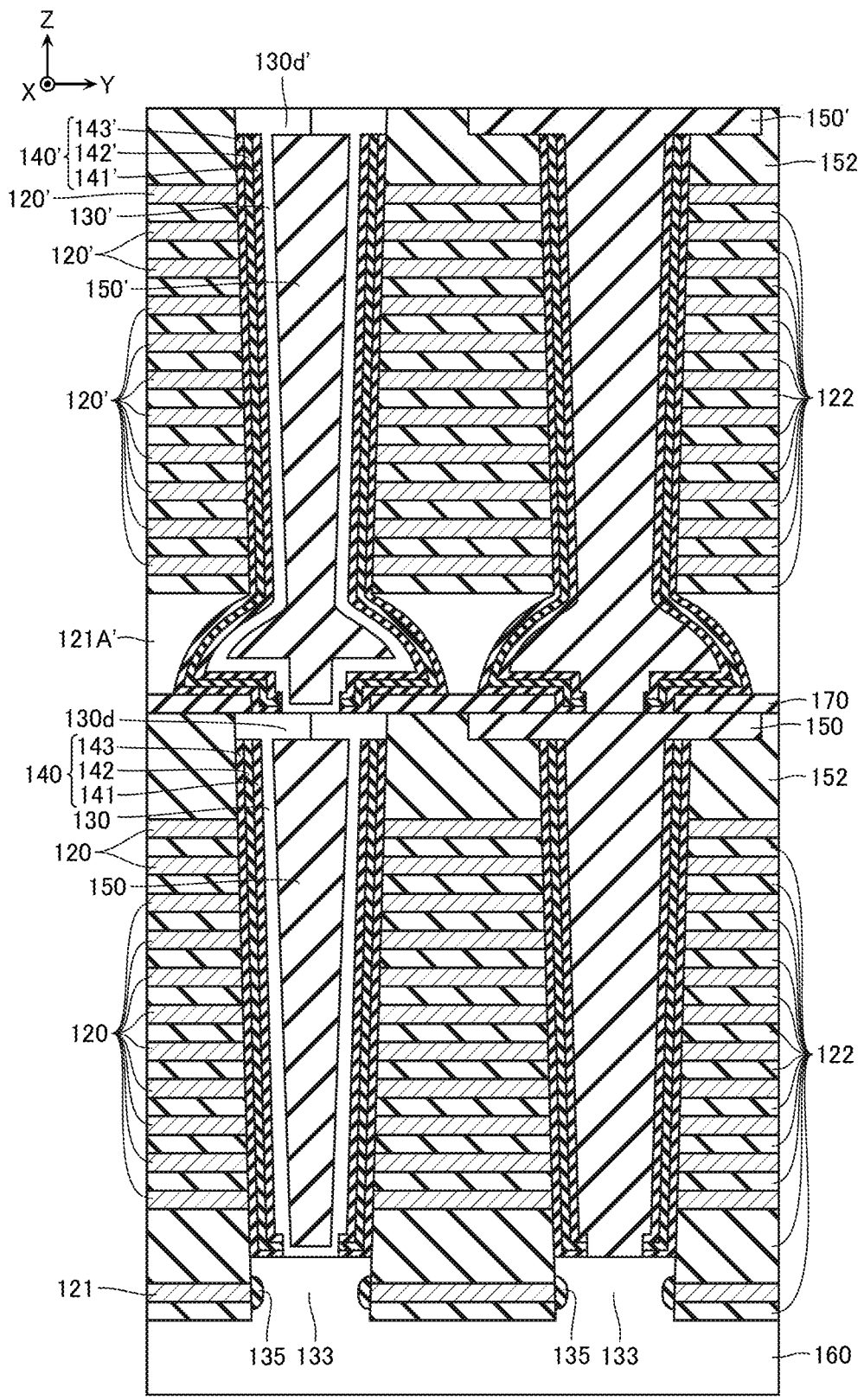
FIG. 35 is a schematic cross-sectional view illustrating the manufacturing method.

Subsequently, as illustrated in FIG. 35, the insulating layer 135 is formed on the side surfaces of the semiconductor layer 133 via openings (not illustrated). This process is performed by an oxidation treatment or the like.

Subsequently, as illustrated in FIG. 35, the conducting layer 121, the conducting layers 120, and the conducting layers 120' are formed between the insulating layers 122 arranged in the Z-direction via openings (not illustrated). This process is performed by CVD, wet etching, and the like.

Figure 36:
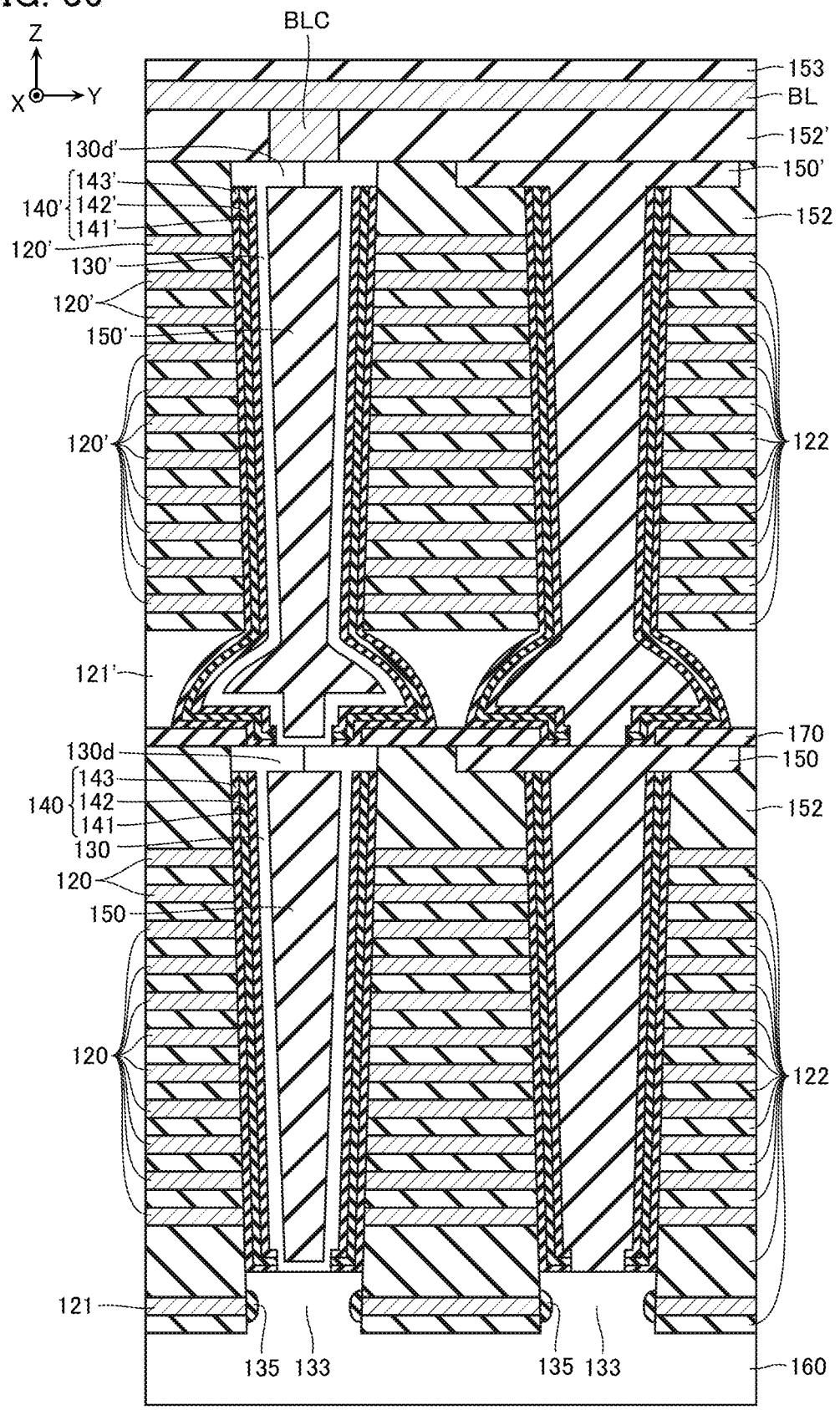
FIG. 36 is a schematic cross-sectional view illustrating the manufacturing method.

Subsequently, for example, as illustrated in FIG. 36, an insulating layer 152' of silicon oxide ($SiO_2$) or the like, a bit line contact BLC of copper (Cu) or the like, a bit line BL of copper (Cu) or the like, an insulating layer 153 of silicon oxide ($SiO_2$) or the like are formed on an upper surface of the structure illustrated in FIG. 35. Thus, the structure described with reference to FIG. 2 and the like is formed.

Effect

In the method for manufacturing the semiconductor memory device according to the embodiment, the plurality of sacrificial layers 120A and insulating layers 122 are formed in the process described with reference to FIGS. 6A and 6B, the openings MTa are formed to the plurality of sacrificial layers 120A and insulating layers 122 in the process described with reference to FIGS. 7A and 7B, and the semiconductor layer 130B and the gate insulating film 140 are formed inside the openings MTa in the process described with reference to FIG. 9A to FIG. 11B. The sacrificial layers 120A are removed to form the conducting layers 120 in the process described with reference to FIG. 35.

Here, for high integration of the semiconductor memory device, for example, it is considered to increase the number of laminations of the sacrificial layer 120A and the insulating layer 122 in the process described with reference to FIGS. 6A and 6B to form the openings MTa having the large aspect ratio in the process described with reference to FIGS. 7A and 7B. However, forming the openings MTa having the large aspect ratio is not easy in some cases.

Therefore, in the method for manufacturing the semiconductor memory device according to the embodiment, after the process described with reference to FIG. 9A to FIG. 19B, the plurality of sacrificial layers 120A' and insulating layers 122 are formed in the process described with reference to FIG. 20, the openings MTb are formed to the plurality of sacrificial layers 120A' and insulating layers 122 in the process described with reference to FIG. 21, and the semiconductor layer 130B' and the gate insulating film 140' are formed inside the openings MTb in the process described with reference to FIG. 24 to FIG. 26.

With this method, the semiconductor memory device can be highly integrated without forming the opening MTa having the large aspect ratio. However, in this method, an accurate positioning between the position in the Y-direction of the opening MTa (FIGS. 7A and 7B) and the position in the Y-direction of the opening MTb (FIG. 21) is required, thus possibly causing a decreased yield.

To reduce the decrease in yield, for example, it is considered to form a semiconductor part (hereinafter referred to as a "joint semiconductor layer") having a large width in the Y-direction between the semiconductor layer 130 formed inside the opening MTa and the semiconductor layer 130' formed inside the opening MTb to connect them. However, when the joint semiconductor layer is formed by a method, such as a photolithography, the positioning between the semiconductor layer 130 and the joint semiconductor layer and the positioning between the joint semiconductor layer and the semiconductor layer 130' are required, thus possibly failing to appropriately reduce the decrease in yield.

Therefore, in the manufacturing method according to the embodiment, the side surface in the Y-direction of the semiconductor layer 130B is exposed in the process described with reference to FIGS. 18A and 18B, and the part 130d of the semiconductor layer 130 is formed by the method, such as the epitaxial growth, in the process illustrated in FIGS. 19A and 19B. With this method, the part 130d of the semiconductor layer 130 can be functioned as the joint semiconductor layer. In this method, the positional relationship between the part 130d and the other parts of the semiconductor layer 130 can be self-conformably determined, thus eliminating the need for the positioning between the semiconductor layer 130 and the joint semiconductor layer. Accordingly, the decrease in yield can be appropriately reduced.

With this method, the interface layer is not formed between the part 130a and the part 130d of the semiconductor layer 130. Similarly, the interface layer is not formed between the part 130b and the part 130d of the semiconductor layer 130. Accordingly, the resistance value in the semiconductor layer 130 can be reduced compared with the case where the joint semiconductor layer is formed by the method, such as the photolithography.

As described above, in the manufacturing method according to the embodiment, the openings MTb are formed to the plurality of sacrificial layers 120A' and insulating layers 122 in the process described with reference to FIG. 21. With this method, the width in the Y-direction of the lower end of the opening MTb is decreased and it is difficult to cause the upper surface of the part 130d of the semiconductor layer 130 to be appropriately exposed in some cases. This causes the decrease in yield in some cases.

Therefore, in the manufacturing method according to the embodiment, the openings MTb are formed in the process described with reference to FIG. 21, the widths in the Y-direction of the lower portions of the openings MTb are increased in the process described with reference to FIG. 22, the insulating layer 170 is partially removed in the process described with reference to FIG. 23, and subsequently, the semiconductor layer 130B' is formed inside the openings MTb in the process illustrated in FIG. 24 to FIG. 26.

With this method, since the insulating layer 170 is removed in the state where the width in the Y-direction of the opening MTb is increased, the upper surface of the part 130d of the semiconductor layer 130 can be appropriately exposed. Accordingly, the decrease in yield can be appropriately reduced.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a substrate; and
a first memory layer disposed above the substrate in a first direction that intersects with a surface of the substrate, wherein
the first memory layer includes:
a plurality of first conducting layers arranged in the first direction and extending in a second direction that intersects with the first direction;
a plurality of first insulating layers disposed between the respective plurality of first conducting layers;
a plurality of second conducting layers separated from the plurality of first conducting layers in a third direction that intersects with the first direction and the second direction, the plurality of second conducting layers being arranged in the first direction and extending in the second direction;
a plurality of second insulating layers disposed between the respective plurality of second conducting layers; and
a first semiconductor layer that includes a first part, a second part, and a third part, the first part extending in the first direction and opposing the plurality of first conducting layers and the plurality of first insulating layers, the second part extending in the first direction and opposing the plurality of second conducting layers and the plurality of second insulating layers, and the third part being connected to the first part and the second part and positioned farther from the substrate than the first part and the second part, and when:
- a cross-sectional surface extending in the second direction and the third direction and including at least a part of the third part is defined as a first cross-sectional surface;
- a region of the third part on one side in the third direction with respect to a first imaginary center line in the third direction in the first cross-sectional surface is defined as a first region, and a region on the other side is defined as a second region;
- the first imaginary center line is an imaginary line extending in the second direction and passing through a position at a half of a maximum width in a part where a width in the third direction of the third part in the first cross-sectional surface is maximum; and
- in the first cross-sectional surface,
- the third part has a maximum width in the second direction in the first region defined as a first width,
- the third part has a maximum width in the second direction in the second region defined as a second width, and
- the third part has a width in the second direction on the first imaginary center line defined as a third width,
- the third width is smaller than the first width, and
- the third width is smaller than the second width.

2. The semiconductor memory device according to claim 1, further comprising
a second memory layer disposed above the first memory layer in the first direction, wherein
the second memory layer includes:
- a plurality of third conducting layers arranged in the first direction and extending in the second direction;
- a plurality of third insulating layers disposed between the respective plurality of third conducting layers;
- a plurality of fourth conducting layers separated from the plurality of third conducting layers in the third direction, the plurality of fourth conducting layers being arranged in the first direction and extending in the second direction;
- a plurality of fourth insulating layers disposed between the respective plurality of fourth conducting layers; and
- a second semiconductor layer that includes a fourth part, a fifth part, and a sixth part, the fourth part extending in the first direction and opposing the plurality of third conducting layers and the plurality of third insulating layers, the fifth part extending in the first direction and opposing the plurality of fourth conducting layers and the plurality of fourth insulating layers, and the sixth part being connected to the fourth part and the fifth part, and
the sixth part is in contact with the third part.

3. The semiconductor memory device according to claim 2, wherein
the second semiconductor layer includes a seventh part connected to the fourth part and the fifth part, the seventh part is positioned in the first direction with respect to the sixth part, and
when:
- a cross-sectional surface extending in the second direction and the third direction and including at least a part of the seventh part is defined as a second cross-sectional surface;
- a region of the seventh part on one side in the third direction with respect to a second imaginary center line in the third direction in the second cross-sectional surface is defined as a third region, and a region on the other side is defined as a fourth region;
- the second imaginary center line is an imaginary line extending in the second direction and passing through a position at a half of a maximum width in a part where a width in the third direction of the seventh part in the second cross-sectional surface is maximum; and
- in the second cross-sectional surface,
- the seventh part has a maximum width in the second direction in the third region defined as a fourth width,
- the seventh part has a maximum width in the second direction in the fourth region defined as a fifth width, and
- the seventh part has a width in the second direction on the second imaginary center line defined as a sixth width,
the sixth width is smaller than the fourth width, and
the sixth width is smaller than the fifth width.

4. The semiconductor memory device according to claim 1,
when:
- a distance in the third direction between a surface on one side in the third direction and a surface on the other side in the third direction of the first part is defined as a first distance; and
- a distance in the third direction between a surface on one side in the third direction and a surface on the other side in the third direction of the second part is defined as a second distance,
a width in the third direction of the third part is larger than a sum of the first distance and the second distance.

5. A semiconductor memory device comprising:
a substrate;
a first memory layer disposed above the substrate in a first direction that intersects with a surface of the substrate; and
a second memory layer disposed above the first memory layer in the first direction, wherein
the first memory layer includes:
- a plurality of first conducting layers arranged in the first direction and extending in a second direction that intersects with the first direction;
- a plurality of first insulating layers disposed between the respective plurality of first conducting layers;
- a plurality of second conducting layers separated from the plurality of first conducting layers in a third direction that intersects with the first direction and the second direction, the plurality of second conducting layers being arranged in the first direction and extending in the second direction;
- a plurality of second insulating layers disposed between the respective plurality of second conducting layers;
- a first semiconductor layer that includes a first part, a second part, and a third part, the first part extending in the first direction and opposing the plurality of first conducting layers and the plurality of first insulating layers, the second part extending in the first direction and opposing the plurality of second conducting layers and the plurality of second insulating layers, and the third part being connected to the first part and the second part; and
- a third insulating layer disposed between the first part and the second part and extending in the first direction and the second direction, the second memory layer includes:
- a plurality of third conducting layers arranged in the first direction and extending in the second direction;
- a plurality of fourth insulating layers disposed between the respective plurality of third conducting layers;
- a plurality of fourth conducting layers separated from the plurality of third conducting layers in the third direction, the plurality of fourth conducting layers being arranged in the first direction and extending in the second direction;
- a plurality of fifth insulating layers disposed between the respective plurality of fourth conducting layers;
- a second semiconductor layer that includes a fourth part, a fifth part, and a sixth part, the fourth part extending in the first direction and opposing the plurality of third conducting layers and the plurality of fourth insulating layers, the fifth part extending in the first direction and opposing the plurality of fourth conducting layers and the plurality of fifth insulating layers, and the sixth part being connected to the fourth part and the fifth part, and
- a sixth insulating layer disposed between the fourth part and the fifth part and extending in the first direction and the second direction, the sixth part is connected to the third part, the sixth insulating layer includes:
- a seventh part disposed on the first memory layer side with respect to the plurality of third conducting layers and the plurality of fourth conducting layers, the seventh part having a first width in the third direction;
- an eighth part disposed on the first memory layer side with respect to the seventh part, the eighth part having a second width in the third direction; and
- a ninth part disposed on the first memory layer side with respect to the eighth part, the ninth part having a third width in the third direction, the second width is larger than the first width, and
the second width is larger than the third width.

6. The semiconductor memory device according to claim 5, wherein
the second memory layer further includes a third semiconductor layer disposed on the first memory layer side with respect to the plurality of third conducting layers and the plurality of fourth conducting layers, the third semiconductor layer extends in the second direction, and when:
- a surface of the third semiconductor layer on the first memory layer side in the first direction is defined as a first surface, and
- a surface of the third semiconductor layer on an opposite side of the first memory layer in the first direction is defined as a second surface, the eighth part is closer to the first memory layer than the second surface and farther from the first memory layer than the first surface.

* * * * *